(12) United States Patent
Ueno et al.

(10) Patent No.: US 6,737,336 B2
(45) Date of Patent: May 18, 2004

(54) SEMICONDUCTOR DEVICE AND MANUFACTURING METHOD THEREFOR

(75) Inventors: Shuuichi Ueno, Tokyo (JP); Yasuo Inoue, Tokyo (JP); Masayoshi Shirahata, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/183,408

(22) Filed: Jun. 28, 2002

(65) Prior Publication Data

US 2002/0167066 A1 Nov. 14, 2002

Related U.S. Application Data

(62) Division of application No. 09/225,469, filed on Jan. 6, 1999, now Pat. No. 6,417,555.

(30) Foreign Application Priority Data

Jul. 8, 1998 (JP) .......................................... 10-193037

(51) Int. Cl.[7] .............................................. H01L 21/76
(52) U.S. Cl. .................... 438/430; 438/431; 438/432
(58) Field of Search ................................ 438/430, 431, 438/432

(56) References Cited

U.S. PATENT DOCUMENTS

| 4,571,819 | A |   | 2/1986 | Rogers et al. |
| 4,666,556 | A |   | 5/1987 | Fulton et al. |
| 4,741,802 | A | * | 5/1988 | Okumura ................... 438/386 |
| 4,946,800 | A |   | 8/1990 | Li |
| 5,148,247 | A |   | 9/1992 | Miura et al. |
| 5,191,509 | A | * | 3/1993 | Wen ........................... 361/311 |
| 5,308,785 | A |   | 5/1994 | Comfort et al. |
| 5,792,687 | A | * | 8/1998 | Jeng et al. .................. 438/253 |
| 5,877,067 | A | * | 3/1999 | Kimura et al. .............. 438/430 |
| 5,956,600 | A | * | 9/1999 | Kuroi et al. ................ 438/446 |
| 6,207,515 | B1 | * | 3/2001 | Hsieh et al. ................ 438/300 |
| 6,383,905 | B2 | * | 5/2002 | Lee ............................ 438/592 |

FOREIGN PATENT DOCUMENTS

| JP | 59-135743 | 8/1984 |
| JP | 63-266878 | 11/1988 |
| JP | 2-114654 | 4/1990 |
| JP | 4-209551 | 7/1992 |
| JP | 11233614 A | 8/1999 |

OTHER PUBLICATIONS

Wolf, S., Silicon Processing for the VLSI Era, vol. 1, 1986 by Lattice Press, pp. 179–180.

* cited by examiner

Primary Examiner—George Fourson
Assistant Examiner—Michelle Estrada
(74) Attorney, Agent, or Firm—McDermott, Will & Emery

(57) ABSTRACT

A semiconductor device having a trench isolation structure which has a high insulating characteristic, is suitable for miniaturizing a semiconductor device, and prevents a leakage current, as well as a method of manufacturing the semiconductor device. A small-density polysilicon film is formed between a semiconductor substrate and a CVD silicon oxide film in the area within a trench where a trench isolation structure is to be formed. Mechanical stress that develops between the semiconductor substrate and the CVD silicon oxide film during heat treatment is mitigated by changing the crystalline structure of the polysilicon film.

10 Claims, 19 Drawing Sheets

31: polysilicon film

201: active region

202: isolation Region

14: polysilicon oxide film

31: polysilicon film

15:capacitor

32:polysilicon film

41:CVD silicon oxide film

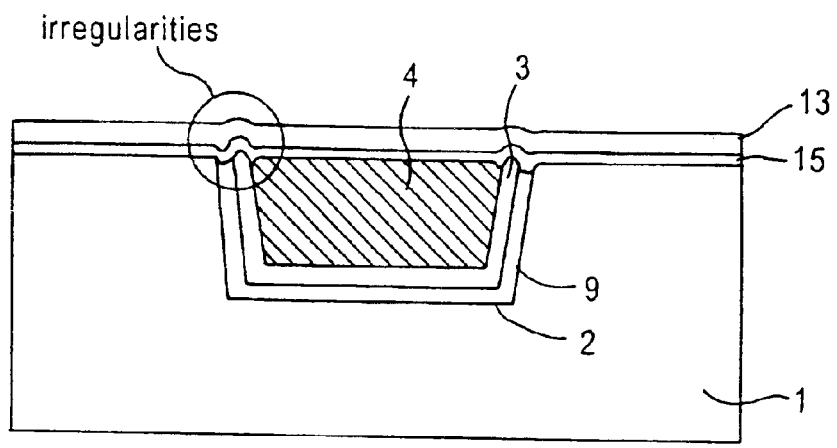
FIG. 14
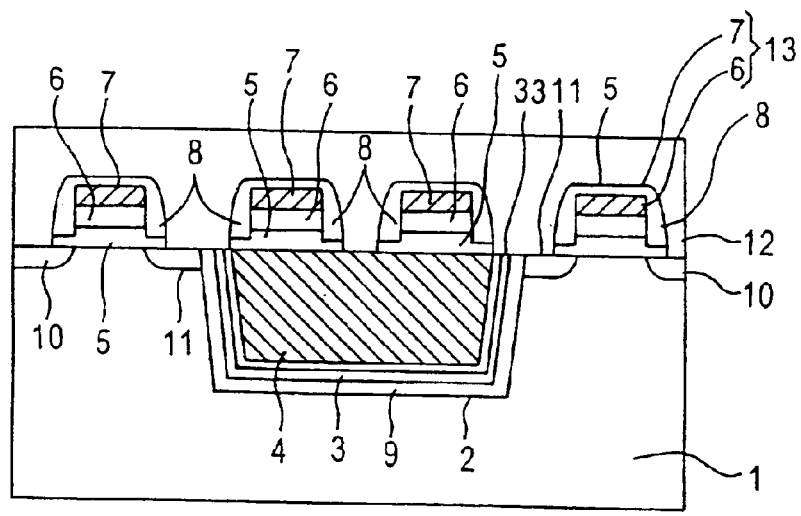
FIG. 15   3∩.polysilicon oxide film

34: polysilicon oxide film

35:polysilicon nitride film

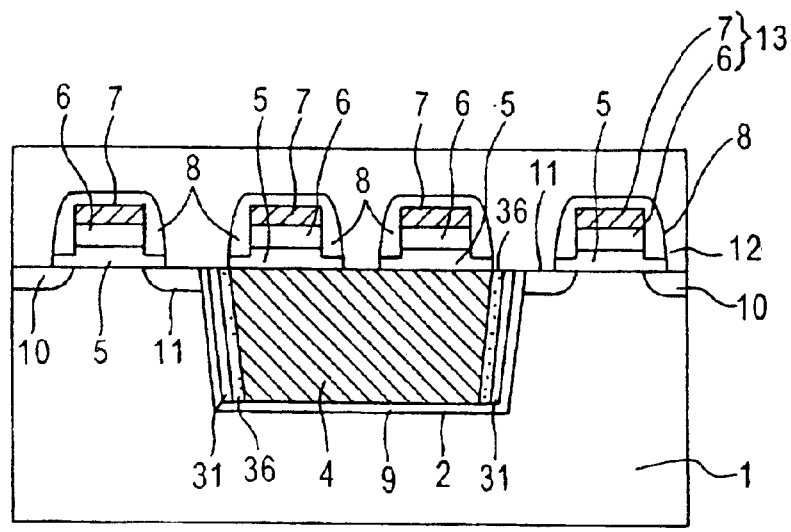
FIG. 22   36:polysilicon nitride film
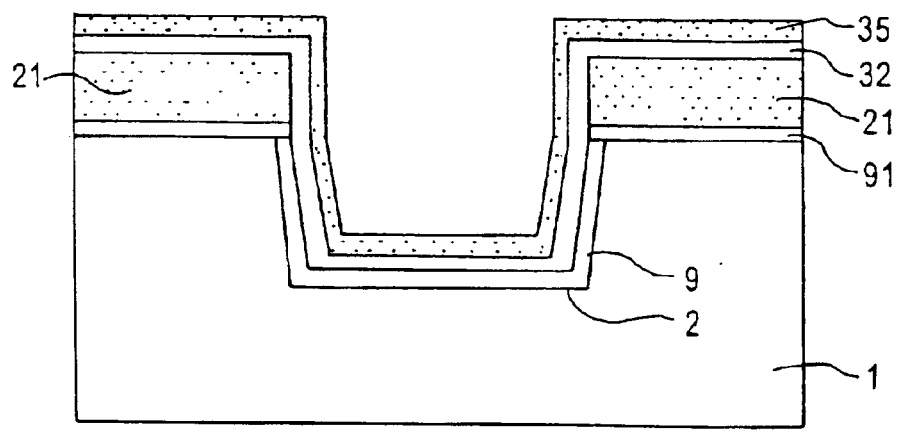
FIG. 23

37: polysilicon film

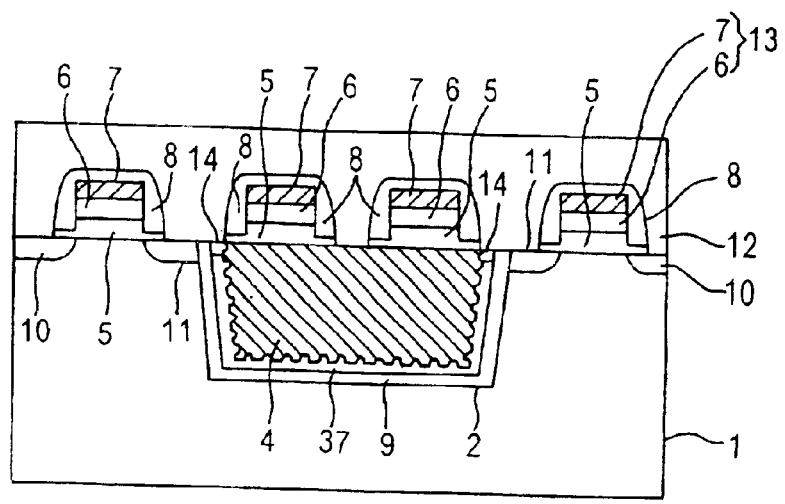
FIG. 26
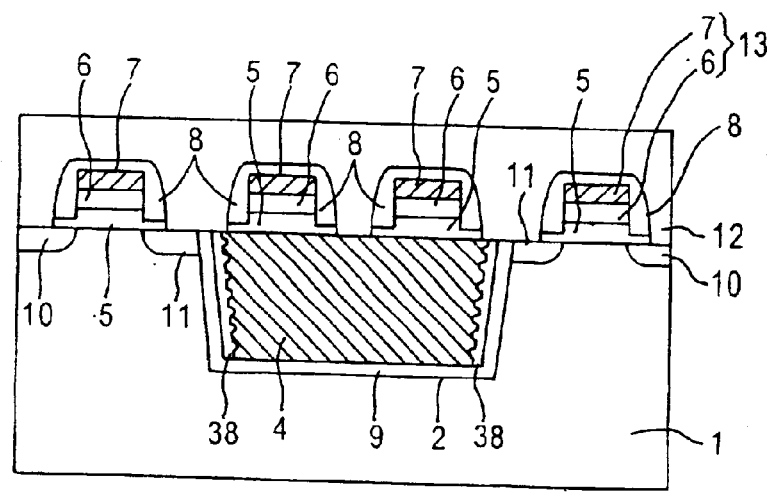
FIG. 27  38: polysilicon film

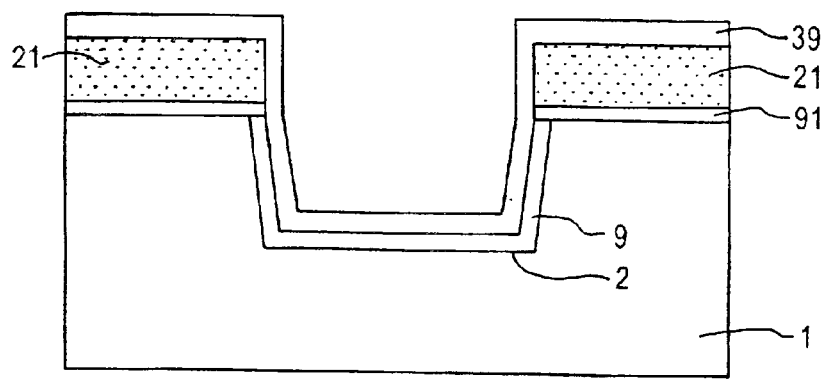
FIG. 28    39:amorphous silicon film
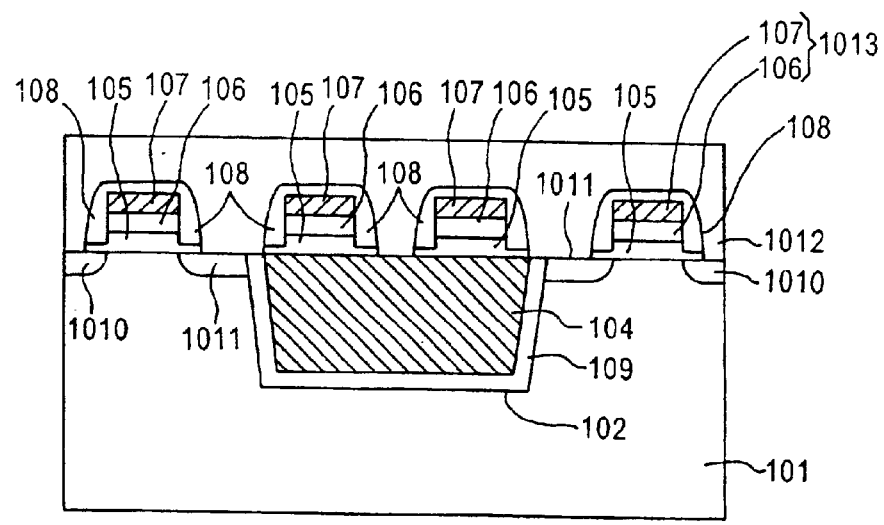
FIG. 29
(PRIOR ART)

SEMICONDUCTOR DEVICE AND MANUFACTURING METHOD THEREFOR

This application is a divisional of application Ser. No. 09/225,469 filed Jan. 6, 1999, now U.S. Pat. No. 6,417,555.

BACKGROUND OF THE INVENTION

1. Field of the Invention

The present invention relates to a semiconductor device and a manufacturing method therefor, and more particularly, to an isolation structure of a semiconductor device.

2. Description of Related Art

Trench isolation is one method of isolating and insulating semiconductor elements from one another. A trench isolation structure is formed by forming a trench in the surface of a semiconductor substrate, and by filling the trench with a polysilicon film or a silicon oxide film. Compared with other insulation and isolation structures, the trench isolation structure requires a much smaller area and involves much lower parasitic capacitance. Therefore, the trench isolation structure is suitable for increasing the density of and the operating speed of a semiconductor device.

FIG. 29 is a cross-sectional view of a conventional MOS semiconductor device having a trench isolation structures. In the drawing, reference numeral 101 designates a semiconductor substrate; 102 designates a trench; 104 designates a buried film; 105 designates a gate insulating film; 106 designates a polysilicon layer; 107 designates a metal silicide layer; 108 designates a sidewall; 109 designates a silicon oxide film; 1010 and 1011 designate source/drain regions; 1012 designates an interlayer insulating film; and 1013 designates a gate electrode. The gate electrode 1013 is formed from the polysilicon layer 106 and the metal silicide layer 107. An isolation region is formed from a trench isolation structure comprising the trench 102, the silicon oxide film 109, and the buried film 104.

Japanese Patent Application Laid-open Nos. 4-209551 and 2-114654 disclose a structure which is formed by filling an trench isolation with a polysilicon film and capping a surface of the trench isolation by thermal oxidation. As can be seen from FIG. 29, in the MOS semiconductor device, the gate electrode 1013 runs over the trench isolation structure and is shared among a plurality of transistors. Therefore, the buried film 104 must be formed from a silicon oxide film having a highly-insulating characteristic.

FIG. 30 is a cross-sectional view of a trench isolation structure of a conventional semiconductor device. In the drawing, reference numeral 110 designates what is called a bird's beak.

Silicon oxide films include several types of films; among them a silicon oxide film formed by thermal oxidation (hereinafter referred to as a "thermal oxide film") and a silicon oxide film (hereinafter referred to as a "CVD silicon oxide film) formed by CVD (Chemical Vapor Deposition). The thermal oxide film is formed by forming the trench 102 in the surface of the semiconductor substrate 101 and subjecting the substrate to a heat treatment for a long period of time. As a result, the bird's beak 110 becomes larger, as shown in FIG. 30. In contrast, the CVD silicon oxide film retards formation of the bird's beak and is suitable for miniaturizing a semiconductor element. A semiconductor device for which a trench isolation structure is formed through use of a CVD silicon oxide film is disclosed in Japanese Patent Application Laid-open Nos. 59-135743 and 63-266878.

A method of manufacturing a semiconductor device having a trench isolation structure through use of a CVD silicon oxide film will now be described.

FIGS. 31 to 34 are cross-sectional views showing a process of manufacturing a conventional semiconductor device, and FIG. 34 is a cross-sectional view of a trench isolation structure of the conventional semiconductor device. In FIG. 31, reference numeral 1021 designates a silicon nitride film; and 1091 designates a silicon oxide film.

First, the silicon oxide film 1091 and the silicon nitride film 1021 are formed on the semiconductor substrate 101. Through use of a photoresist mask (not shown), the silicon nitride film 1021 is patterned in such a way as to open an area where the trench 102 is to be formed. FIG. 31 is a cross-sectional view of an element of a semiconductor device obtained after completion of the foregoing processing operations.

Next, after the silicon oxide film 1091 and the semiconductor substrate 101 have been etched while the silicon nitride film 1021 is used as a mask, the inner wall of the trench 102 is subjected to thermal oxidation, thereby forming the silicon oxide film 109. FIG. 32 is a cross-sectional view of the element of the semiconductor device obtained after completion of the foregoing operations.

In FIG. 33, reference numeral 1041 designates a CVD silicon oxide film. As seen in the drawing, the trench 102 is filled with the CVD silicon oxide film 1041, and the substrate is then subjected to heat treatment at 1000° C. in an oxygen atmosphere for about one hour. FIG. 33 is a cross-sectional view of the element of the semiconductor device obtained after completion of the foregoing processing operations.

After the silicon substrate has been made smooth by means of CMP (Chemical Mechanical Polishing), the silicon nitride film 1041 and the silicon oxide film 1091 are removed, thereby completing the trench isolation structure.

Since the CVD silicon oxide film has a low density, mere embedding of the film into the trench results in a poor-quality CVD silicon oxide film; the silicon oxide film assumes particularly poor quality in the center of the trench 102. As a result, the CVD silicon oxide film 1041 is etched when the silicon oxide film 1091 and other silicon oxide films are removed by hydrofluoric acid, thereby forming a recess in the CVD silicon oxide film 1041 such as that shown in FIG. 34. For this reason, after deposition of the CVD silicon oxide film 1041, the substrate is subjected to heat treatment so as to improve the etch resistance characteristics of the CVD silicon oxide film 1041, thereby preventing formation of a recess.

The semiconductor device shown in FIG. 29 is formed by sequentially forming the gate insulation film 105, the gate electrodes 1013, the source/drain regions 1010 and 1011, and the sidewalls 108.

Since the CVD silicon oxide is formed in such a manner as mentioned above, formation of a bird's beak is retarded when compared with the case in which a buried film is formed from a thermal oxide film. Consequently, the CVD silicon oxide film is suitable for miniaturizing a semiconductor element.

However, in the conventional semiconductor device, if the substrate is subjected to heat treatment in order to improve the quality of the CVD silicon oxide film after the CVD silicon oxide film was formed, or if the substrate is subjected to heat treatment during the process of fabrication of an element, for reasons of a difference in coefficient of thermal expansion between the CVD silicon oxide film and the semiconductor substrate, the volume of the CVD silicon oxide film filled in the trench is changed to exert mechanical stress (stress) in an area between the semiconductor substrate and a buried layer. The stress induces defects in the semiconductor substrate around the trenches. If such a semiconductor substrate is subjected to heat treatment in an oxygen atmosphere, the CVD silicon oxide film expands, as a result of which defects become particularly noticeable.

FIG. 35 is a cross-sectional view of an element of a conventional semiconductor device and shows an NMOS when a leakage current flows because of defects. In the drawing, reference numeral 120 designates a defect; 130 designates an electron; and 140 designates a hole. Because of the semiconductor device being subjected to the heat treatment after deposition of the CVD silicon oxide film, the defect 120 is formed in the semiconductor substrate around the trench. The defect 120 deteriorates the reliability of the element, in addition to causing the electron 130 and the hole 140 to form a pair. As a result of migration of the electron 130 and the hole 140 in the directions indicated by arrows in the drawing, a leakage current flows in the source/drain region, thereby causing a faulty operation or an increase in power consumption. Memory cells in DRAM (Dynamic Random Access Memory) store information by means of electric charges stored in a capacitor and perform refresh (i.e., read/write operations) at regular time intervals. In the event of a leakage current flowing by means of defects, the information stored in the capacitor is excessively lost, thus deteriorating the refresh characteristics of the memory cells.

SUMMARY OF THE INVENTION

The present invention has been conceived in light of the foregoing drawbacks of the prior art, and the object of the present invention is to provide a semiconductor device having a trench isolation structure which has a high insulating characteristic, is suitable for miniaturizing an element, and is capable of reducing a leakage current, as well as to provide a method of manufacturing the semiconductor device.

According to a first aspect of the present invention, there is provided a semiconductor device comprising a semiconductor substrate having a trench formed in a main surface; a polysilicon film formed on a surface of an area of the semiconductor substrate within the trench; and a CVD silicon oxide film formed on the surface of the polysilicon film filling the trench; and an element formed in an active region surrounded by the trench formed in the main surface of the semiconductor substrate.

In the semiconductor device, the trench may be disposed between the active region and an other active region, and the polysilicon film may be surrounded independently each of the active region and the other active region.

Here, the semiconductor device may further comprise a first thermal oxide film between the polysilicon film and the CVD silicon oxide film.

Here, the semiconductor device may further comprise a silicon nitride film between the polysilicon film and the CVD silicon oxide film.

In the semiconductor device, the polysilicon film may have irregular surface.

In the semiconductor device, the element formed on the main surface of the semiconductor substrate may have source/drain regions formed in the main surface of the semiconductor substrate and may have a gate electrode formed on the main surface of the semiconductor substrate by way of an gate insulating film.

Here, the semiconductor device may further comprise a silicon oxide film formed between an edge of the polysilicon film and the gate insulating film.

Here, the semiconductor device may further comprise an interlayer insulating film covering the surface of the semiconductor substrate and having an opening; and a capacitor connecting to either the source region or the drain regions by way of the opening.

Here, the semiconductor device may further comprise a second thermal oxide film formed between the semiconductor substrate and the polysilicon film.

According to a second aspect of the present invention, there is provided a method of manufacturing a semiconductor device comprising the steps of forming a trench to surround an active region by etching a main surface of a semiconductor substrate while the main surface in the active region of the semiconductor substrate is masked; forming a polysilicon film to cover the surface of the trench; depositing a CVD silicon oxide film over the entire surface of the trench by filling the trench; subjecting the semiconductor substrate to heat treatment; planarizing the surface of the CVD silicon oxide film; removing the mask; and forming an element on the main surface in the active region of the semiconductor substrate.

In the semiconductor device manufacturing method, after the step of forming a polysilicon film, the method may further comprise the step of etching the polysilicon film formed on the surface of the bottom of the trench in the semiconductor substrate.

In the semiconductor device manufacturing method, after the step of forming a polysilicon film, the method may further comprise the step of forming a thermal oxide film on the surface of the polysilicon film.

In the semiconductor device manufacturing method, after the step of forming a polysilicon film, the method may further comprise the step of forming a silicon nitride film on the surface of the polysilicon film.

In the semiconductor device manufacturing method, the surface of the polysilicon film may have irregularities.

In the semiconductor device manufacturing method, after the step of forming a polysilicon film, the method may further comprise the step of forming irregularities by etching the surface of the polysilicon film.

In the semiconductor device manufacturing method, the step of formation of the polysilicon film may comprise a step of formation of an amorphous silicon film and a step of subjecting the semiconductor substrate to heat treatment in a vacuum.

Here, the semiconductor device manufacturing method may further comprise the steps of forming a gate insulating film on the main surface of the semiconductor substrate by thermal oxidation; forming a gate electrode on the surface of the gate insulating film; and forming source/drain regions on the main surface of the semiconductor substrate.

Here, the semiconductor manufacturing method may further comprise the steps of forming a sidewall on the side surface of the gate electrode; forming an interlayer insulating film over the entire surface of the semiconductor substrate; forming an opening to permit communication between the surface of the interlayer insulating film and either the source region or the drain region; and forming a capacitor to be connected to either the source region or the drain region by way of the opening.

In the semiconductor manufacturing method, after the step of forming a trench and prior to the step of forming a polysilicon film, the method may further comprise the step of forming a thermal oxide film on the surface of the semiconductor substrate within the trench.

The above and other objects, effects, features and advantages of the present invention will become more apparent from the following description of the embodiments thereof taken in conjunction with the accompanying drawings.

BRIEF DESCRIPTION OF THE DRAWINGS

FIG. 14 is a cross-sectional view of a semiconductor device describing a semiconductor device according to embodiment 2 of the present invention.

FIGS. 15 to 17 are cross-sectional views showing a semiconductor device according to embodiment 2 of the present invention.

FIGS. 20 to 22 are cross-sectional views showing a semiconductor device according to embodiment 3 of the present invention.

FIGS. 23 and 24 are cross-sectional views showing a process of manufacturing a semiconductor device according to the embodiment 3 of the present invention.

FIGS. 25 to 27 are cross-sectional views showing a semiconductor device according to embodiment 4 of the present invention.

FIG. 28 is a cross-sectional view showing a process of manufacturing a semiconductor device according to the embodiment 4 of the present invention.

FIGS. 29 and 30 are cross-sectional views showing a conventional MOS semiconductor device.

It is noted that the same reference symbols in the drawings denote the same or corresponding components.

Embodiment 1

Figure 1:
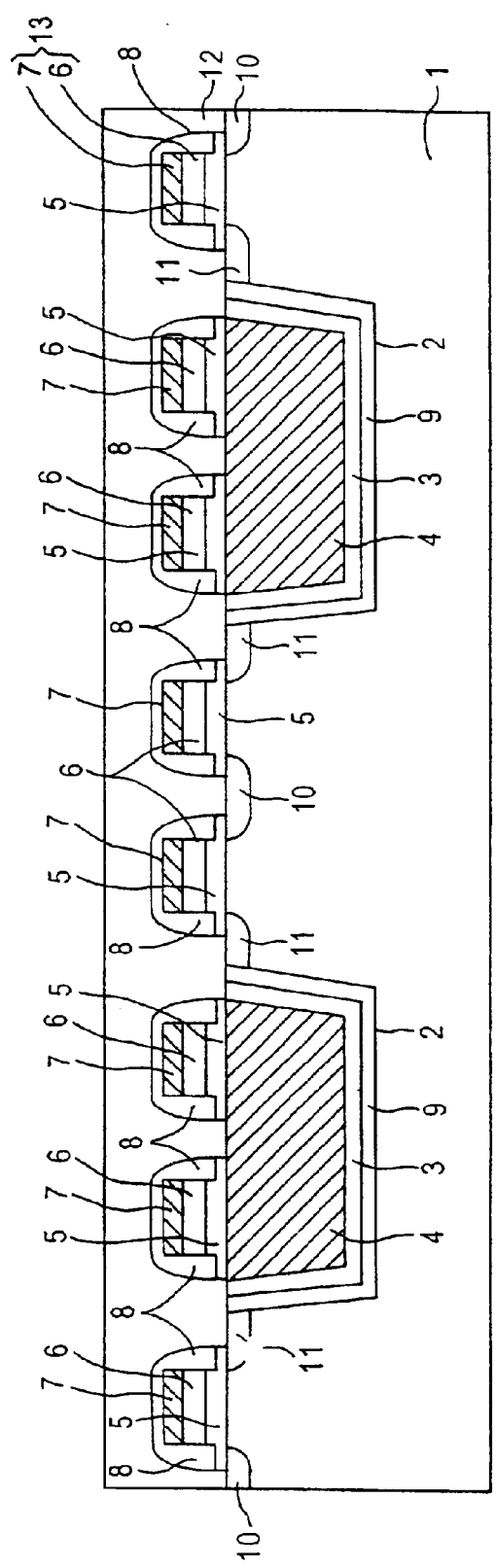
FIG. 1 is a cross-sectional view showing a semiconductor device according to embodiment 1 of the present invention.

FIG. 1 is a cross-sectional view of a semiconductor device according to embodiment 1 of the present invention. In the drawing, reference numeral 1 designates a semiconductor substrate; 2 designates a trench; 3 designates a polysilicon film; 4 designates a CVD silicon oxide film; 5 designates a gate insulating film; 6 designates a polysilicon layer; 7 designates a metal silicide layer; 8 designates a sidewall; 9 designates a silicon oxide film; 10 and 11 designate source/drain regions; 12 designates an interlayer insulating film; and 13 designates a gate electrode. The gate electrode 13 is formed from the polysilicon layer 6 and the metal silicide layer 7, which is formed from, for example, tungsten silicide. A trench isolation structure is formed from the trench 2, the polysilicon film 3, the CVD silicon oxide film 4 and the silicon oxide film 9. A plurality of contact holes are formed in the interlayer insulating film 12, and wiring layers are connected to the source/drain regions 10, 11 and the gate electrodes 13 by way of the respective contact holes (not shown).

Figure 2:
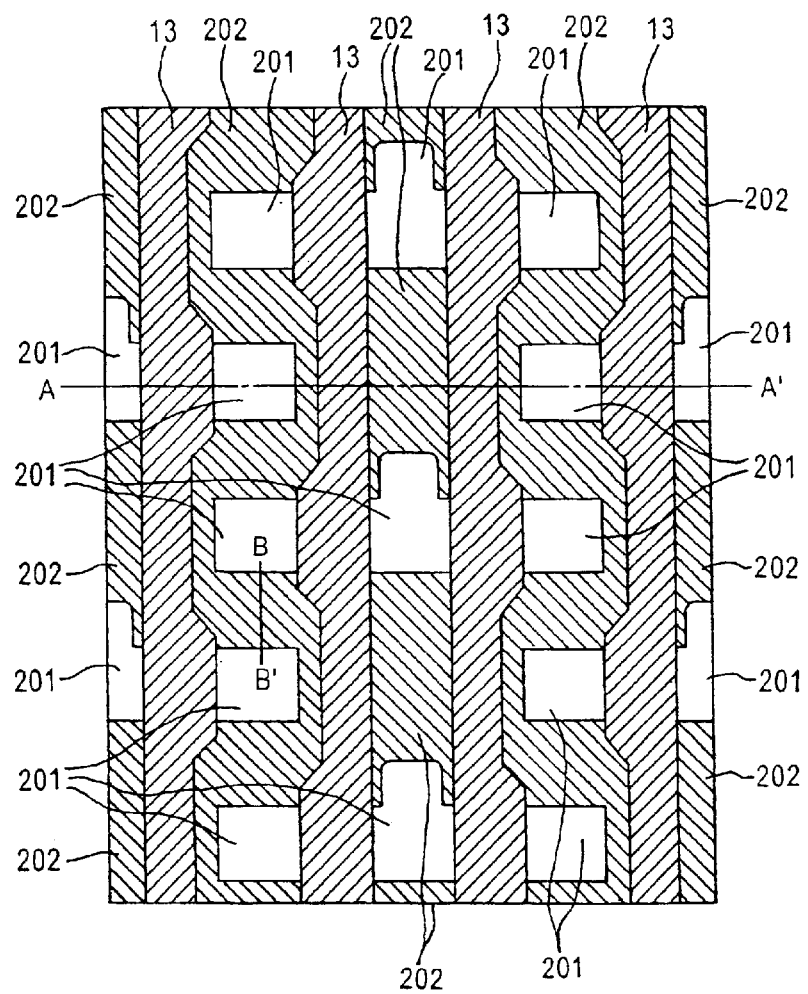
FIG. 2 is a top view showing a semiconductor device according to embodiment 1 of the present invention.

FIG. 2 is a top view showing the semiconductor device according to the embodiment 1. In the drawing, reference numeral 201 designates an active region; and 202 designates an isolation region. A cross-sectional view taken along line A-A' shown in FIG. 2 represents the semiconductor device shown in FIG. 1 at a stage of manufacture before the sidewalls 8 and the interlayer insulating film 12 have been formed on the device. In the isolation region 202 there are formed the trench 2, the silicon oxide film 9 capping the entire surface of the area of the semiconductor substrate 1 within the trench 2, and the trench isolation structure formed by growing the CVD silicon oxide film 4 on the silicon oxide film 9 so as to fill the trench 2. As can be seen from FIG. 2, the gate electrode 13 runs over the isolation region 202 and is shared among a plurality of active regions.

Although in the embodiment 1 the present invention is described through use of a semiconductor device in which two transistors are formed in one active region, the present invention is not particularly limited to such a semiconductor device.

Turning again to FIG. 1, when, for example, a gate length L assumes a value of 200 to 300 nm, the width of the trench 2 assumes a value of 600 to 900 nm, and the depth of the same assumes a value of about 200 to 500 nm. Here, the width of the trench 2 varies according to its location, and the narrowest width (the width of the trench 2 along line B-B' shown in FIG. 2) assumes a value of about 200 to 300 nm. The silicon oxide film 9 having a thickness of about 5 to 30 nm and the polysilicon film 3 having a thickness of about 20 to 50 nm are formed so as to cover the surface of the semiconductor substrate within the trench 2. The inside of the trench 2 is filled with the CVD silicon oxide film 4. The gate insulating film 5 having a thickness of about 3 to 15 nm is formed on the surface of the area of the semiconductor substrate 1 within the active region. The gate electrode 13 is formed on the gate insulating film 5 from the polysilicon layer 6 having a film thickness of about 50 to 150 nm and the metal silicide layer 7 having a film thickness of about 50 to 150 nm. During the process of formation of the trench 2 in the semiconductor substrate 1, defects are formed in the semiconductor substrate 1. In a case where the influence of the defects on the characteristic of an element is sufficiently small, the silicon oxide film 9 may be omitted. Further, in a case where an impurity layer (not shown)—which is of the same conductivity type as the semiconductor substrate 1—is formed in the substrate, the silicon oxide film 9 may be omitted.

The polysilicon layer 6 contains, at a concentration of about $1 \times 10^{21}$ atoms/cm$^3$, impurities such as phosphorous and arsenic (i.e., n-type impurities) or boron or boron fluoride (i.e., p-type impurities). The source/drain region also contains impurities such as phosphorous and arsenic, or boron and boron fluoride. The concentration of impurities differs as needed. When a high concentration of impurity is required, the impurity concentration may assume a value of $1 \times 10^{20}$ atoms/cm$^3$ or more. In contrast, when a low concentration of impurity is required, the impurity concentration may assume a value of about $1 \times 10^{18}$ atoms/cm$^3$ to $1 \times 10^{19}$ atoms/cm$^3$. Further, in the case of the lightly-doped drain (LDD) (not shown), the source/drain regions 10 and 11 extend further in a downward direction with respect to the gate. The portions of the source/drain regions 10 and 11 extending downward beyond the gate assume an impurity concentration of about $1\times10^{18}$ atoms/cm$^3$, and the illustrated portions of the source/drain regions 10 and 11 assume an impurity concentration of $1\times10^{20}$ atoms/cm$^3$ or more.

The thickness of the polysilicon film 3 is about one-tenth to one-third the width of the trench 2. A substance may be used as a substitute for the polysilicon film 3, so long as the substance has a dielectric constant smaller than that of polysilicon and has substantially the same density as polysilicon.

Channels are formed along the surface of the semiconductor substrate 1 below the gate electrodes 13 by application of a voltage to the gate electrodes 13, the source/drain regions 10 and 11, and the semiconductor substrate 1 (i.e., wells). One of the source/drain regions 10 and 11 acts as the source electrode, and the other region acts as the drain electrode, and an electric current flows between the drain electrode and the source electrode. For instance, in the case of an nMOS transistor, there are applied voltages: $V_G$=2.5V, $V_D$=2.5V, $V_S$=0V, and $V_B$=0V or thereabouts.

The polysilicon film 3 is formed between the semiconductor substrate 1 and the CVD silicon oxide film 4 within the semiconductor device. By deforming the structure of the film along grain boundaries of polysilicon, at the time of heat treatment, the polysilicon film acts as a stress mitigation film for absorbing mechanical stress developing between the semiconductor substrate 1 and the CVD silicon oxide film 4, thereby enabling mitigation of stress. As a result, the insulation of the trench isolation structure formed from the CVD silicon oxide film suitable for miniaturizing an element is improved, and defects can be prevented from arising in the semiconductor substrate around the trench, thereby improving the reliability of the element. Further, there is prevented a leakage current which would otherwise flow by way of defects, thereby preventing faulty operations of the semiconductor device and resulting in a reduction in power consumption.

Figure 3:
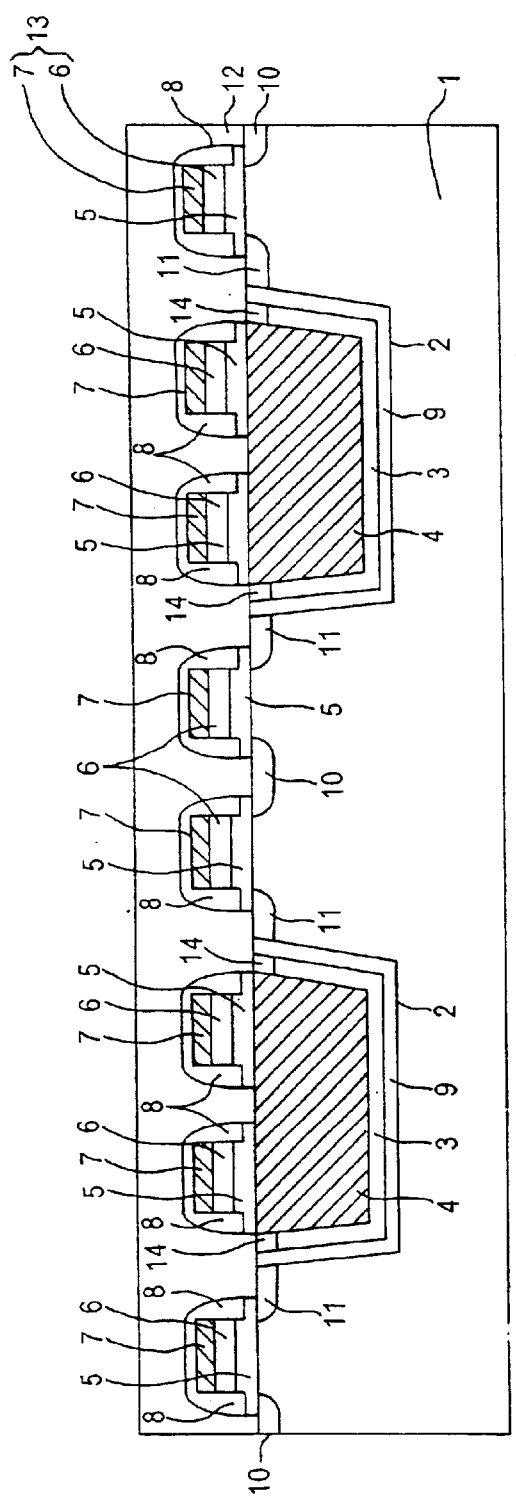
FIGS. 3 to 5 are cross-sectional views showing a semiconductor device according to embodiment 1 of the present invention.

FIG. 3 is another cross-sectional view of the semiconductor device according to the embodiment 1. In the drawing, reference numeral 14 designates a polysilicon oxide film.

The semiconductor device shown in FIG. 3 is equal in structure to that shown in FIG. 1, except that the polysilicon oxide film 14 is formed by over the entire surface of a boundary between the polysilicon film 3 and the gate insulating film 5. The gate electrode 13 runs over the trench isolation structure and is shared among a plurality of transistors. With such a configuration of the semiconductor device shown in FIG. 1, when a high voltage is applied to the gate electrodes 13 and the source/drain regions 10 and 11, a leakage current may flow from one of the gate electrodes to an adjacent gate electrode over the trench isolation structure along the polysilicon film 3, thereby applying a voltage to the gate electrode, which should initially be protected from voltage application. However, the presence of the polysilicon oxide film 14 enhances insulation of the polysilicon film 3 from the gate electrode 13 formed thereon, thereby preventing faulty operations of the semiconductor device and improving the characteristics of the same to a much greater extent.

Figure 4:
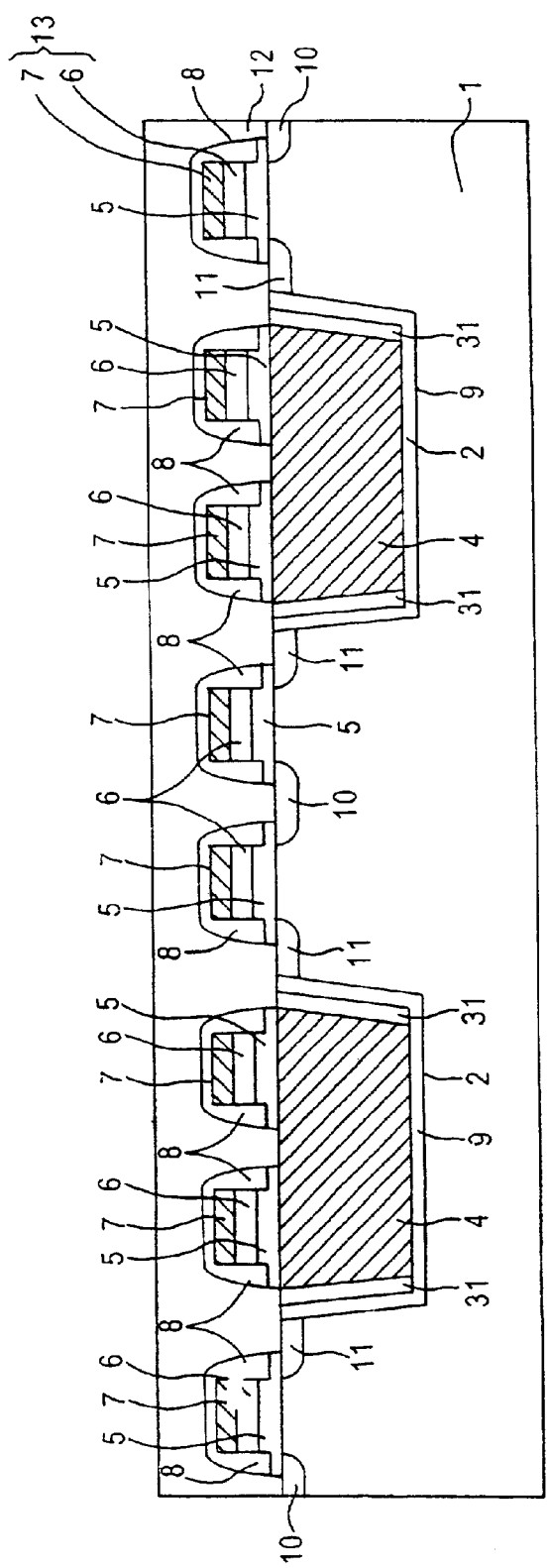

FIG. 4 is a still another cross-sectional view of the semiconductor device according to the embodiment 1. In the drawing, reference numeral 31 designates a polysilicon film. This semiconductor device has the same structure as that shown in FIG. 1, except for the polysilicon film 31. The polysilicon film 31 is formed along only the internal sidewall of the trench. In the semiconductor device shown in FIG. 1, when a high voltage is applied to the gate electrodes 13 and the source/drain regions 10 and 11, a leakage current may flow between adjacent active regions by way of the trench isolation structure, along the polysilicon film. However, in the semiconductor device according to the present embodiment, since the polysilicon film 31 is independently provided in each active region, a leakage current has no chance of flowing to adjacent active regions along the polysilicon film, and the semiconductor device yields the advantage of the stress developing between the CVD silicon oxide film 4 and the semiconductor substrate 1 being mitigated. So long as the polysilicon films 31 are provided in active regions so as to become separated from one another, the polysilicon film may be formed in a portion of the bottom surface of the trench.

Figure 5:
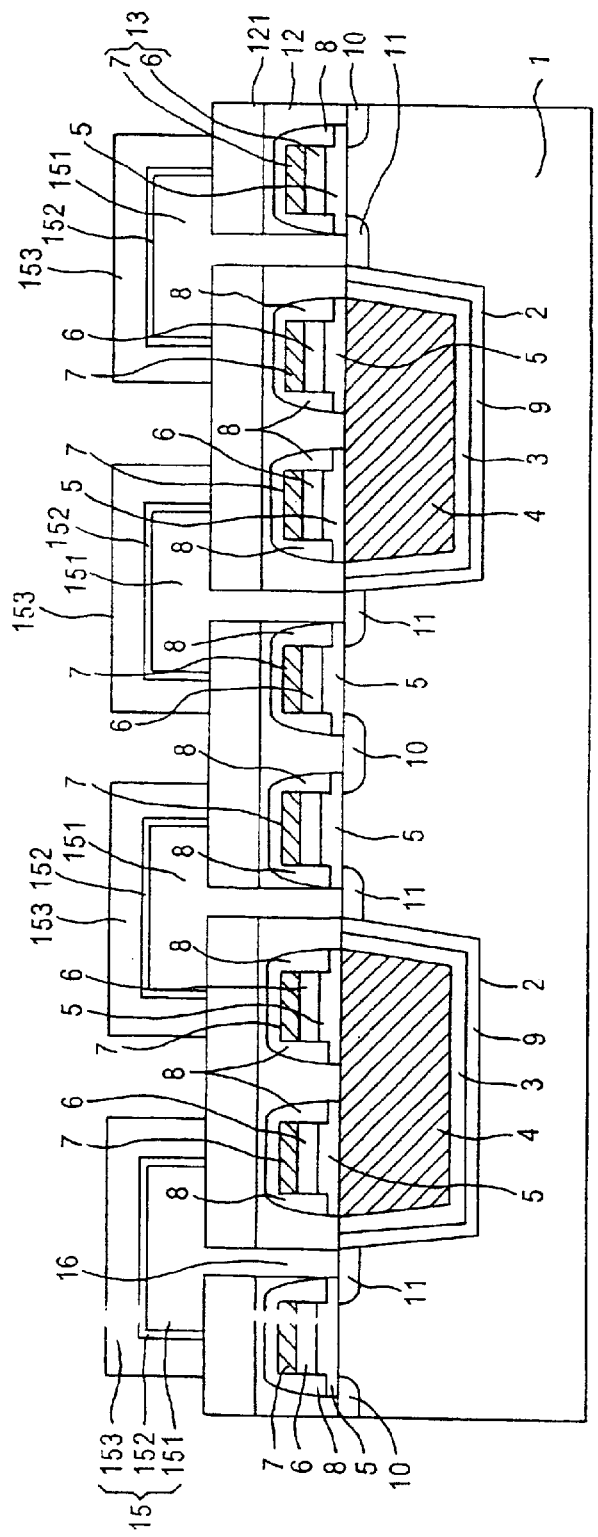

FIG. 5 is yet another cross-sectional view of the semiconductor device according to the embodiment 1. FIG. 5 is an example of a portion of memory cells in DRAM. In the drawing, reference numeral 15 designates a capacitor; 16 designates a contact hole; 121 designates an interlayer insulating film; 151 designates a storage node; 152 designates a capacitor insulating film; and 153 designates a cell plate. By way of the contact hole 16 formed in the interlayer insulating films 12 and 121, the capacitor 15 comprising the storage node 151, the capacitor insulating film 152 and the cell plate 153 is formed so as to connect with the source/drain region 11 and a wiring layer (not shown) which will become a bit line. If a leakage current is reduced, the loss of data stored in the memory cells of DRAM is prevented, thereby improving the refresh characteristic of DRAM.

Figure 6:
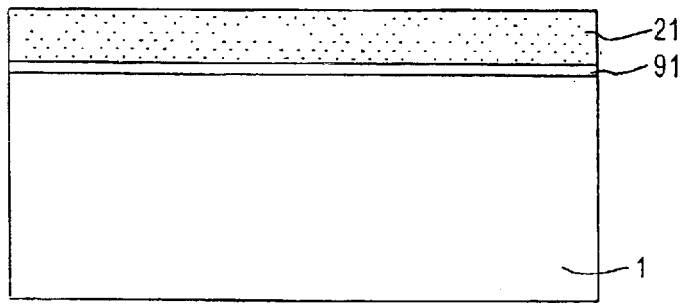
FIGS. 6 to 13 are cross-sectional views showing a process of manufacturing a semiconductor device according to the embodiment 1 of the present invention.

FIGS. 6 through 13 are cross-sectional views showing one process of manufacturing the semiconductor device according to the embodiment 1. In FIG. 6, reference numeral 21 designates a silicon nitride film; and 91 designates a silicon oxide film.

First, after the silicon oxide film 91 has been formed to a thickness of about 10 to 30 nm on the semiconductor substrate 1 by means of thermal oxidation, the silicon nitride film 21 is formed to a thickness of about 50 to 250 nm. FIG. 6 is a cross-sectional view of the element of the semiconductor device after completion the foregoing processing step.

Figure 7:
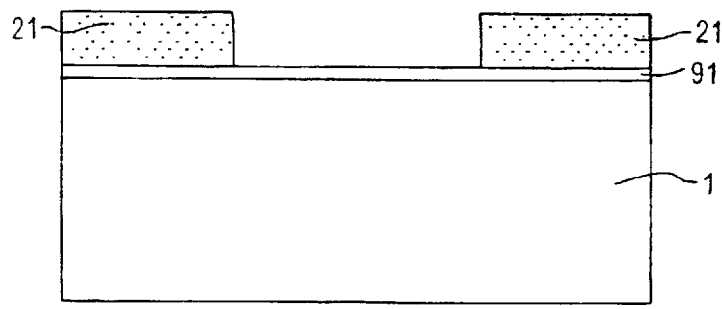

Next, the semiconductor substrate is anisotropically etched through use of a photoresist mask (not shown) which is formed on the silicon nitride film 21 so as to exclude an area where the trench 2 is to be formed. The silicon nitride film 21 is patterned, and the photoresist mask is removed. FIG. 7 is a cross-sectional view of the element of the semiconductor device after completion of the foregoing processing step.

Figure 8:
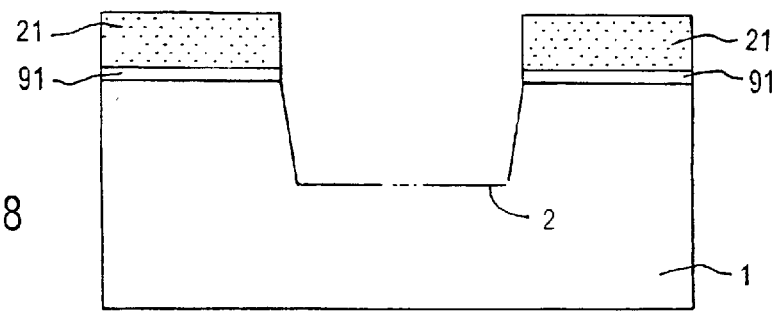

The silicon oxide film 91 and the semiconductor substrate 1 are anisotropically etched while the remaining silicon nitride film 21 is used as a mask, thereby forming the trench 2 to a depth of about 200 to 500 nm and to a width of about 600 to 900 nm. The width of the trench varies according to location. For example, in the case of the cross sectional view taken along line B-B' shown in FIG. 2, the minimum width of the trench assumes a value of 200 to 300 nm. FIG. 8 is a cross-sectional view of the element of the semiconductor device after completion of the foregoing processing step.

Figure 9:
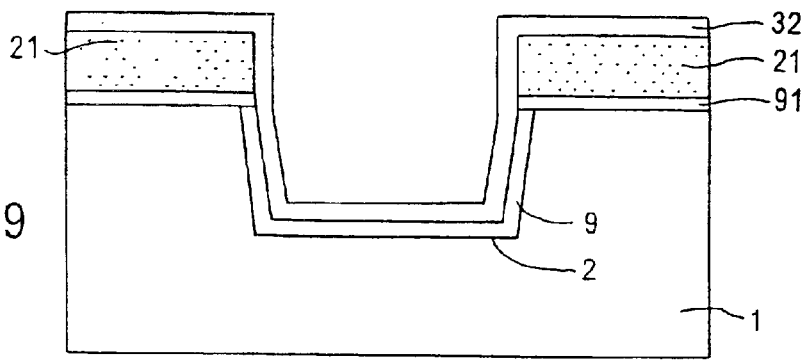

In FIG. 9, reference numeral 32 designates a polysilicon film. The silicon oxide film 9 is formed to a thickness of about 5 to 30 nm by thermal oxidation of the area of the semiconductor substrate 1 within the trench 2, thereby eliminating the defects produced in the surface of the semiconductor substrate 1 during formation of the trench 2. By means of CVD at a temperature of 600 to 800° C., the polysilicon film 32 is formed to a thickness of about 20 to 50 nm. FIG. 9 is a cross-sectional view of the element of the semiconductor device after completion of the foregoing processing step.

Figure 10:
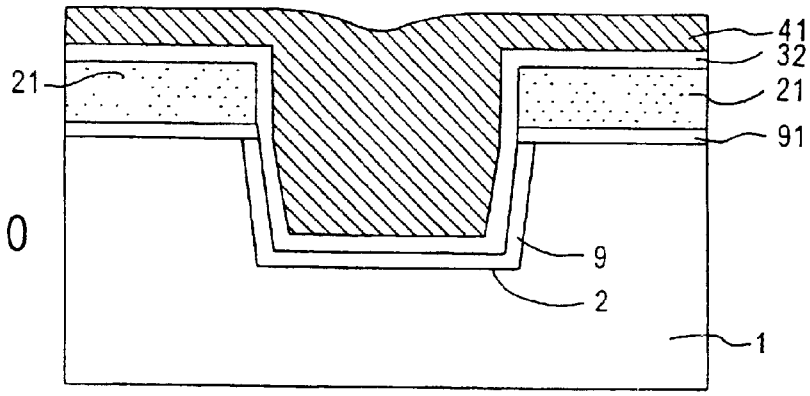

In FIG. 10, reference numeral 41 designates a CVD silicon oxide film. As shown in FIG. 10, the CVD silicon oxide film 41 is deposited to a thickness of about 500 to 1000 nm by means of CVD, and the semiconductor substrate is then subjected to heat treatment in an oxygen atmosphere for about an hour at a temperature of 1000° C. The quality of the CVD oxide film 41 is improved through the heat treatment. FIG. 10 is a cross-sectional view of the element of the semiconductor device after completion of the foregoing processing step.

Figure 11:
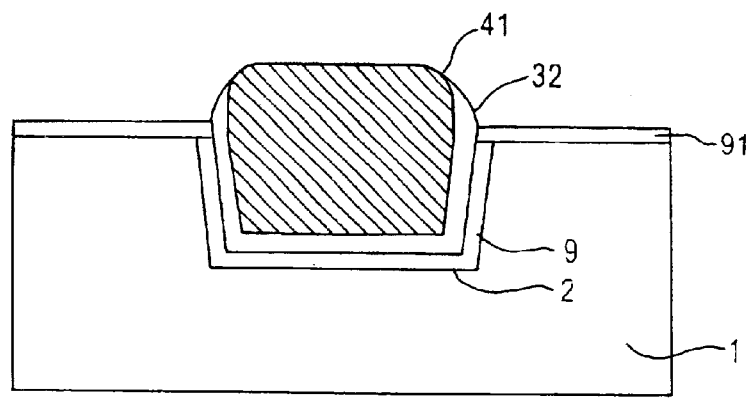

Until the silicon nitride film 21 becomes exposed, the surface of the semiconductor substrate is then made smooth by means of CMP (Chemical and Mechanical Polishing), and the silicon nitride film 21 is excluded. FIG. 11 is a cross-sectional view of the element of the semiconductor device after completion of the foregoing processing step.

Figure 12:
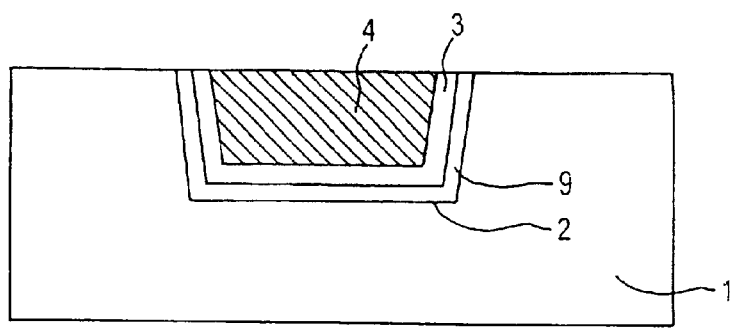

The trench isolation structure is formed by removal of an upper portion of the CVD silicon oxide film 41, an upper portion of the polysilicon film 32, and the silicon oxide film 91. FIG. 12 is a cross-sectional view of the element of the semiconductor device after completion of the foregoing processing step.

After formation of the gate insulating film 5 having a thickness of about 3 to 15 nm, the polysilicon layer 6—which contains impurities at a Concentration of about $1 \times 10^{21}$ atoms/cm$^3$; e.g., such as phosphorous or arsenic in case of n-type impurities, such as boron or boron fluoride in case of p-type impurities—is deposited to a thickness of about 50 to 150 nm by means of CVD. After formation, by means of CVD and sputtering, of the metal silicide layer 7 from, e.g., tungsten silicide, the metal silicide layer 7 is patterned to thereby form a gate electrode 13.

In the case of nMOS, phosphorous or arsenic ions are implanted to the substrate. In contrast, in the case of pMOS, boron or boron fluoride ions are implanted to the substrate. As a result, the source/drain regions 10 and 11 having an impurity concentration of more than $1 \times 10^{21}$ atoms/cm$^3$ are formed. A silicon oxide film is grown to a thickness of about 100 to 150 nm and is etched back, thereby forming the sidewall 8. In a case where the source/drain regions 10 and 11 are formed into lightly-doped drains (LDD), an impurity layer having an impurity concentration of about $1 \times 10^{18}$ atoms/cm$^3$ is formed before formation of the sidewall 8. After formation of the sidewall 8, an impurity layer having an impurity concentration of more than $1 \times 10^{21}$/cm$^3$ is formed by ion implantation. Source/drain regions (not shown) are formed by combination of the thus-formed impurity layers. Subsequently, the interlayer insulating film 12 and wiring layers are sequentially formed, thereby forming the semiconductor device shown in FIG. 1.

Under the previously-described semiconductor device manufacturing method, the polysilicon film 3 is formed between the semiconductor substrate 1 and the CVD silicon oxide film 4. As a result, there can be manufactured a semiconductor device having a stress mitigation film which absorbs mechanical stress arising between the semiconductor substrate 1 and the CVD silicon oxide film 4 during heat treatment by structural deformation of the polysilicon film along grain boundaries of polysilicon. More specifically, a trench isolation structure which is formed from a CVD silicon oxide film suitable for miniaturizing an element has an improved insulating characteristic. A reliability is improved by preventing defects from arising in the periphery of the trench. As a result of prevention of leakage currents which would otherwise flow by way of defects, faulty operations are prevented. So, a semiconductor device having lower power consumption may be provided.

As shown in FIG. 3, when the gate insulating film 5 is formed by means of thermal oxidation, the polysilicon oxide film 14 can be formed on the surface of the polysilicon film 3, thereby improving insulation of the polysilicon film 3 from the gate electrode 13 formed thereon. Accordingly, a leakage current is reliably prevented from arising between the polysilicon film 3 and the gate electrode 13, so that a semiconductor device having an improved characteristic is produced.

Figure 13:
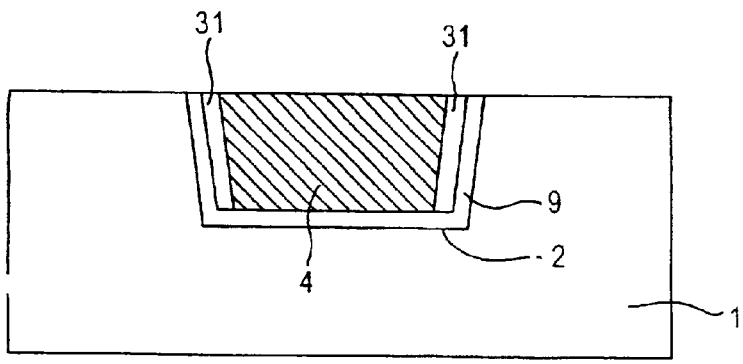

As shown in FIG. 13, after formation of the polysilicon film 32, the semiconductor substrate is anisotropically or isotropically etched, thereby removing the polysilicon film from the bottom of the trench 2 and forming the polysilicon film 31 on the internal sidewall of the same. As a result, a semiconductor device shown in FIG. 4 is formed.

Under the semiconductor manufacturing method, the polysilicon film 31 can be independently formed on the internal sidewall of the trench 2 in each active region. Accordingly, there is implemented a semiconductor device in which a leakage current has no chance of flowing to adjacent active regions along the polysilicon film and in which stress exerted on the area between the semiconductor substrate 1 and the CVD silicon oxide film 4 is mitigated.

After formation of the interlayer insulating film 12, when the capacitor 15 is formed so as to connect to the source/drain region 11 via a contact hole, as shown in FIG. 5, memory cells of DRAM having an improved refresh characteristic can be produced.

Embodiment 2

FIG. 14 is a cross-sectional view of a semiconductor device for explaining a semiconductor device according to a embodiment 2 of the present invention. More specifically, the drawing shows a cross-section of a semiconductor device taken in a width direction of the gate while the gate electrode 13 is formed. Under the semiconductor manufacturing method according to the embodiment 1, after completion of the processing step shown in FIG. 11, during removal of an upper portion of the remaining CVD silicon oxide film 4, an upper portion of the polysilicon film 32, and the silicon oxide film 91, the polysilicon film 3 may protrude from the semiconductor substrate 1 and the CVD silicon oxide film 4 because of a difference in etch rate between the CVD silicon oxide film and the polysilicon film, thereby causing irregularities in the edge of the surface of the trench isolation structure as shown in FIG. 14. For example, such irregularities acting as steps may break a wiring layer to be formed thereon, or residuals may build up in an indentation, thereby deteriorating the reliability of an element. Further, raised areas are formed in the edge of the active region of the semiconductor substrate 1, thereby causing faulty operations, such as a drop in the threshold value due to the reverse narrow channel effect. The semiconductor device and the manufacturing method therefore according to the embodiment 2 have been conceived in particular consideration of the aforementioned drawback.

FIG. 15 is a cross-sectional view of a semiconductor device according to the embodiment 2. In FIG. 15, reference numeral 33 designates a polysilicon oxide film. In other respects, the semiconductor device according to the embodiment 2 is equal in structure to the semiconductor device shown in FIG. 1. In the drawing, the polysilicon oxide film 33 is formed by oxidation of the polysilicon film 3. Although the polysilicon film 3 preferably remains in the trench, if all the polysilicon film 3 is oxidized to form the polysilicon oxide film 33, the polysilicon oxide film 33 must have a lower density in the vicinity of the semiconductor substrate 1 than that of the CVD silicon oxide film 4 in the trench 2.

In this semiconductor device, as in the case of the embodiment 1, the polysilicon film formed between the semiconductor substrate and the CVD oxide film absorbs mechanical stress. In addition, the polysilicon oxide film 33 formed between the CVD silicon oxide film 4 and the polysilicon film 3 reliably prevents irregularities from arising in the upper surface of the polysilicon film 3. As a result, a drop in the threshold value due to the reverse narrow channel effect is prevented, which in turn prevents faulty operations of the semiconductor device. Further, a break in a wiring layer is also prevented, thus improving the reliability of the element.

Figure 16:
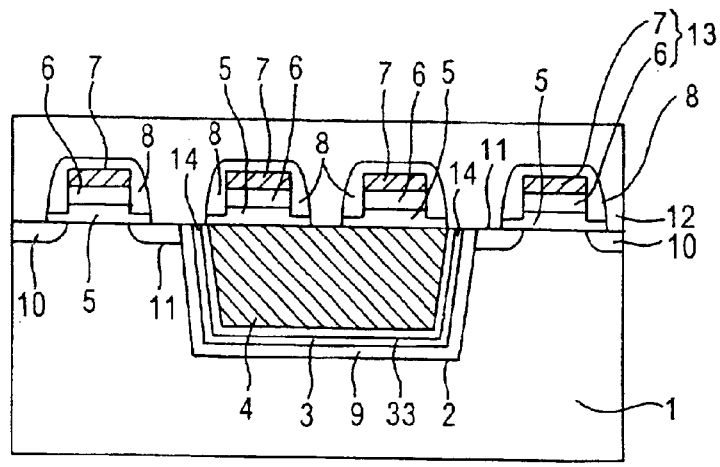

FIG. 16 is another cross-sectional view of the semiconductor device according to the embodiment 2. The semiconductor device according to the embodiment 2 is equal in structure to that shown in FIG. 15, except that the polysilicon oxide film 14 is formed over the entire surface of a boundary area between the polysilicon film 33 and the gate insulating film 5. With the semiconductor device, as in the case of the embodiment 1, it enables improvements in the insulation of the polysilicon film 3 from the gate electrode 13 formed thereon. Accordingly, a leakage current is reliably prevented from arising between the polysilicon film 3 and the gate electrode 13, thus improving the characteristic of the semiconductor device to a much greater extent.

Figure 17:
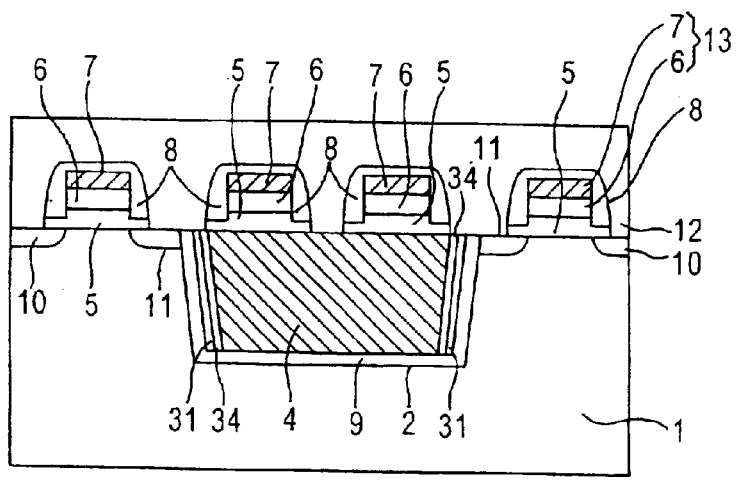

FIG. 17 is still another cross-sectional view of a semiconductor device according to the embodiment 2. In the drawing, reference numeral 34 designates a polysilicon oxide film, and the polysilicon film 31 and the polysilicon oxide film 34 are formed on the internal sidewall of the trench 2. The semiconductor device shown in FIG. 17 is equal in structure to that shown in FIG. 3, except for the polysilicon oxide film 34. As in the case of the embodiment 1, the semiconductor device yields the advantage of eliminating the chance of a leakage current flowing along the polysilicon film, thereby mitigating mechanical stress arising between the semiconductor substrate 1 and the CVD silicon oxide film 4, and preventing faulty operations of the semiconductor device by thorough prevention of a drop in the threshold value.

Furthermore, as in the case of the embodiment 1, if the capacitors 15 are formed by application of the semiconductor manufacturing method according to the present embodiment DRAM memory cells, the refresh characteristic of the DRAM memory cells is improved.

Figure 18:
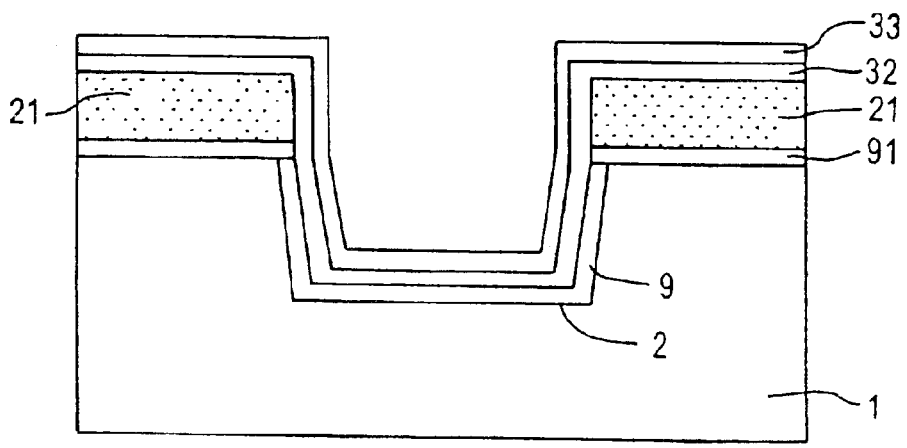
FIGS. 18 and 19 are cross-sectional views showing a process of manufacturing a semiconductor device according to the embodiment 2 of the present invention.
Figure 19:
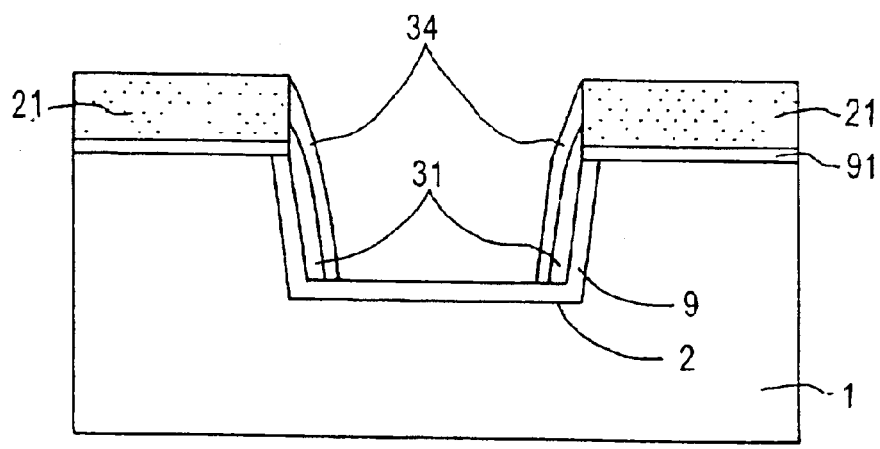

FIGS. 18 and 19 are cross-sectional views showing a process of manufacturing the semiconductor device according to the embodiment 2.

First, as in the case of the embodiment 1, after formation of the trench 2 in the surface of the semiconductor substrate 1, the silicon oxide film 9 is formed in the trench 2 by means of thermal oxidation, and the polysilicon film 32 is formed by means of CVD. As in the case of the embodiment 1, the silicon oxide film 9 may not be formed.

Next, through RTO (Rapid Thermal Oxidation), the surface of the polysilicon film 32 is oxidized at 800 to 900° C. for 15 to 60 seconds. FIG. 18 is a cross-sectional view of the element of the semiconductor device after completion of the foregoing processing step. The processing steps subsequent to the step of forming the CVD silicon oxide film 41 are performed in the same manner as in the embodiment 1, so that the semiconductor device shown in FIG. 15 is formed.

As in the case of the embodiment 1, the semiconductor device manufacturing method according to the embodiment 2 enables production of a semiconductor device which absorbs mechanical stress by means of a polysilicon film formed between the semiconductor substrate and the CVD silicon oxide film. Further, the polysilicon oxide film 33 formed between the CVD silicon oxide film 4 and the polysilicon film 3 reliably prevents irregularities, which would otherwise arise in the top surface of the polysilicon film 3 during removal of an upper portion of the CVD silicon oxide film 41, an upper portion of the polysilicon film 32, and the silicon oxide film 91 in the final phase of formation of the trench isolation structure. Accordingly, a drop in the threshold value due to the reverse narrow channel effect is prevented, thus providing a semiconductor device which does not perform faulty operations, in which a break in wiring layers is prevented, and which has improved reliability.

When the gate insulating film 5 is formed by means of thermal oxidation, as shown in FIG. 16, the polysilicon oxide film 14 can be formed on the surface of the polysilicon film 3, thereby improving insulation of the polysilicon film 3 from the gate electrode 13 formed thereon. Accordingly, a leakage current is reliably prevented from arising between the polysilicon film 3 and the gate electrode 13, so that a semiconductor device having an improved characteristic is produced.

As in the case of the embodiment 1, after formation of the polysilicon film 32, the semiconductor substrate is anisotropically or isotropically etched, thereby forming the polysilicon film 31. By means of RTO, the semiconductor substrate is subjected to thermal oxidation, then the polysilicon film is removed from the bottom of the trench 2, and the polysilicon film 31 and the polysilicon oxide film 34 are formed on the sidewall of the trench 2. FIG. 19 is a cross-sectional view of the element of the semiconductor device after completion of the foregoing processing step. By performing the processing steps subsequent to the step of forming the CVD silicon oxide film 41 in the same manner as in the embodiment 1, the semiconductor device shown in FIG. 17 is produced.

Under the semiconductor manufacturing method according to the present embodiment, the polysilicon film 31 can be independently formed in each active region. Accordingly, there is implemented a semiconductor device in which a leakage current has no chance of flowing to adjacent active regions along the polysilicon film and in which stress exerted on the area between the semiconductor substrate 1 and the CVD silicon oxide film 4 is mitigated.

Further, as in the case of the embodiment 1, if the capacitors 15 are formed by application of the semiconductor manufacturing method to DRAM memory cells, the refresh characteristic of the DRAM can be improved.

Embodiment 3

Figure 20:
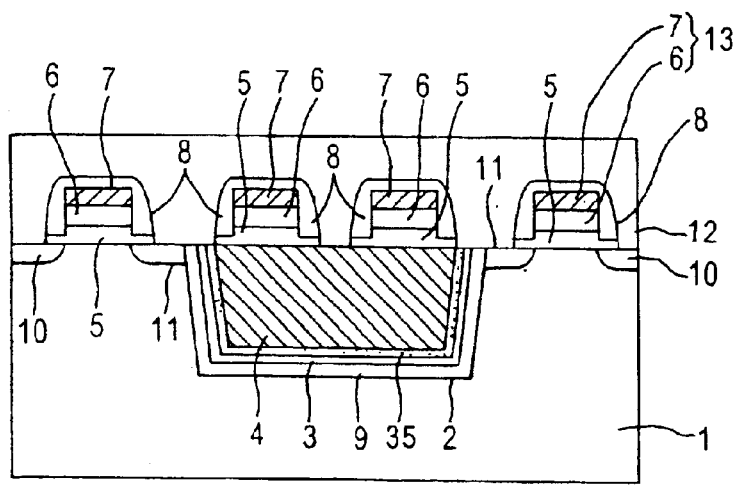

FIG. 20 is a cross-sectional view of a semiconductor device according to a embodiment 3 of the present invention. In the drawing, reference numeral 35 designates a polysilicon nitride film. The polysilicon nitride film 35 covers the area of the semiconductor substrate 1 within the trench 2, together with the polysilicon film 3. In other respects, the semiconductor device according to the embodiment 3 is equal in structure to that shown in FIG. 1.

As in the case of the embodiment 1, the semiconductor device absorbs mechanical stress by means of the polysilicon film 3 formed between the semiconductor substrate and the CVD silicon oxide film 4. Further, the polysilicon nitride film 35 formed between the CVD silicon oxide film 4 and the polysilicon film 3 acts in the direction opposite to that in which the stress acts on the CVD silicon oxide film 4, thereby mitigating to a much greater extent the stress exerted on the area between the CVD silicon oxide film 4 and the semiconductor substrate 1. As a result, the insulation of the trench isolation structure formed from the CVD silicon oxide film suitable for miniaturizing an element is improved, and defects can be prevented from arising in the periphery of the trench, thus improving the reliability of the element. Furthermore, a leakage current, which would otherwise flow by way of defects, is prevented, so that faulty operations of the semiconductor device are prevented, thereby enabling lower power consumption.

Figure 21:
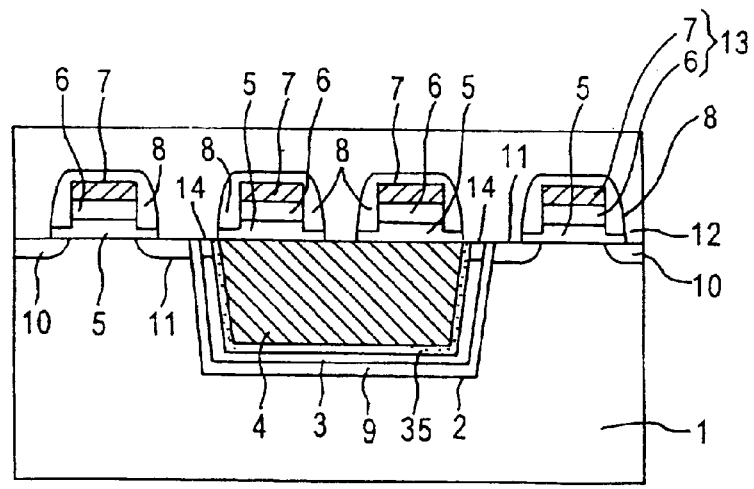

FIG. 21 is another cross-sectional view of the semiconductor device according to the embodiment 3. The semiconductor device is equal in structure as that shown in FIG. 20, except that the polysilicon oxide film 14 is formed over the entire surface of a boundary region between the polysilicon film 3 and the gate insulating film 5.

In the semiconductor device, the polysilicon oxide film 14 is formed on the surface of the polysilicon film 3, as in the case of the embodiment 1, thereby improving the insulation of the polysilicon film 3 from the gate electrode 13 formed thereon. Accordingly, when a high voltage is applied to the gate electrode, a leakage current is reliably prevented from flowing between the polysilicon film 3 and the gate electrode 13, thereby improving the characteristic of the semiconductor device to a much greater extent.

FIG. 22 is still another cross-sectional view of the semiconductor device according to the embodiment 3. In the drawing, reference numeral 36 designates a polysilicon nitride film. The semiconductor device is equal in structure to that shown in FIG. 20, except that the polysilicon nitride film 36 is formed so as to cover the polysilicon film 31 formed only on the sidewall of the trench 2.

In this semiconductor device, since the polysilicon film 31 is independently provided in each active region, there is implemented a semiconductor device in which a leakage current has no chance of flowing to adjacent active regions along the polysilicon film and in which stress exerted on the area between the semiconductor substrate 1 and the CVD silicon oxide film 4 is mitigated. So long as the polysilicon films 31 are provided in active regions so as to become separated from one another, the polysilicon film may be provided in a portion of the bottom surface of the trench.

As in the case of the embodiment 1, when the embodiment 3 is applied to a DRAM memory cell in which a capacitor is formed so as to connect to the source/drain region 11, the refresh characteristic of DRAM is improved.

Figure 24:
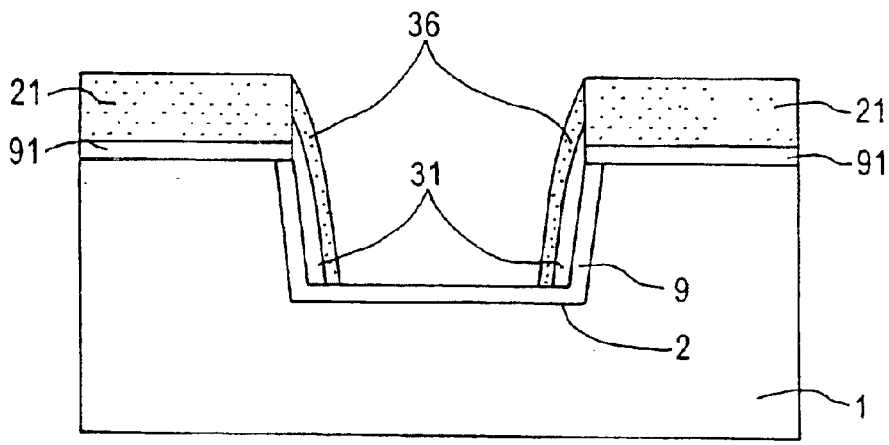

FIGS. 23 and 24 are cross-sectional views showing one process of manufacturing the semiconductor device according to the embodiment 3.

First, as in the case of the embodiment 1, after formation of the trench 2 on the surface of the semiconductor substrate 1, the silicon oxide film 9 is formed by thermal oxidation within the trench 2, and the polysilicon film 32 is formed by means of CVD. As in the case of the embodiment 1, the silicon oxide film 9 may not be formed in some cases.

Next, by means of RTN (Rapid Thermal Nitridation), the surface of the polysilicon film 32 is nitrided at 1000 to 1150° C. for five to thirty seconds. FIG. 23 is a cross-sectional view of the element of the semiconductor device after completion of the foregoing processing step. The processing steps subsequent to the step of formation of the CVD silicon oxide film 4 are performed in the same manner as in the embodiment 1, whereby the semiconductor device shown in FIG. 20 is produced.

Under the semiconductor device manufacturing method according to the embodiment 3, as in the case of the embodiment 1, the polysilicon film 3 formed between the semiconductor substrate 1 and the CVD silicon oxide film 4 absorbs mechanical stress. Further, the polysilicon nitride film 35 is formed between the CVD silicon oxide film 4 and the polysilicon film 3 and acts in the direction opposite to that of the stress exerted on the CVD silicon oxide film 4, thereby mitigating the stress exerted on the area between the CVD silicon oxide film 4 and the semiconductor substrate 1 to a much greater extent. As a result, the insulation of the trench isolation structure formed from the CVD silicon oxide film suitable for miniaturizing an element is improved, and defects can be prevented from arising in the periphery of the trench, thus improving the reliability of the element. Furthermore, there is prevented a leakage current, which would otherwise flow by way of defects, so that faulty operations of the semiconductor device are prevented, thereby enabling lower power consumption.

Further, as a result of the gate insulating film 5 being formed by thermal oxidation as shown in FIG. 21, the polysilicon oxide film 14 is formed on the surface of the polysilicon film 3, thereby improving the insulation of the polysilicon film 3 from the gate electrode 13 formed thereon, as in the case of the embodiment 1. Even when a high voltage is applied to the gate electrode, a leakage current is reliably prevented from flowing between the polysilicon film 3 and the gate electrode 13, thereby improving the characteristic of the semiconductor device to a much greater extent.

As in the case of the embodiment 1, after formation of the polysilicon film 32, the semiconductor substrate is anisotropically or isotropically etched, thereby removing the polysilicon film from the bottom of the trench 2 and forming the polysilicon film 31. The polysilicon nitride film 36 is formed on the surface of the polysilicon film 31 by means of RTN. FIG. 24 is a cross-sectional view of the element of the semiconductor device after completion of the foregoing processing step. The processing steps subsequent to the step of formation of the CVD silicon oxide film 41 are performed in the same manner as in the embodiment 1, and, as shown in FIG. 22, there is formed a semiconductor device in which the polysilicon film 31 and the polysilicon nitride film 36 are formed only on the internal sidewall of the trench 2. In this case, so long as the polysilicon films 31 provided in active regions are separated from one another, the polysilicon film may be provided in a portion of the bottom surface of the trench.

Under the semiconductor device manufacturing method according to the embodiment 3, since the polysilicon film 31 is independently provided in each active region, there is implemented a semiconductor device in which a leakage current has no chance of flowing to adjacent active regions along the polysilicon film and in which stress exerted on the area between the semiconductor substrate 1 and the CVD silicon oxide film 4 is mitigated.

After formation of the interlayer insulating film 12, by formation of the capacitor 15 by way of a contact hole connecting to the source/drain region 11, DRAM memory cells having improved a refresh characteristic can be produced.

Embodiment 4

Figure 25:
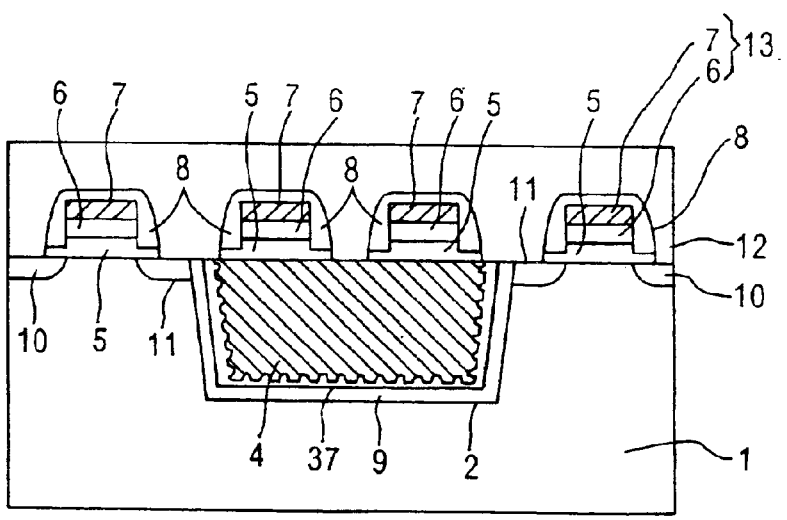
Figure 30:
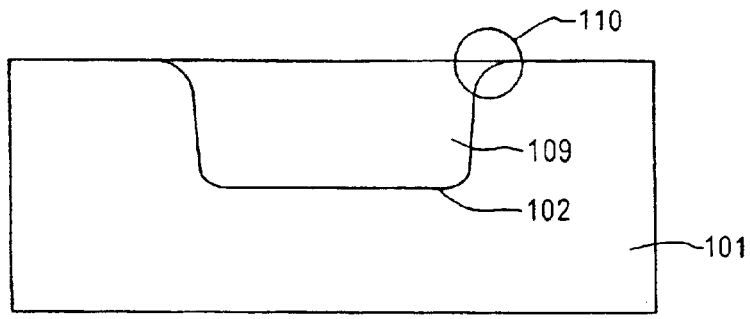
Figure 31:
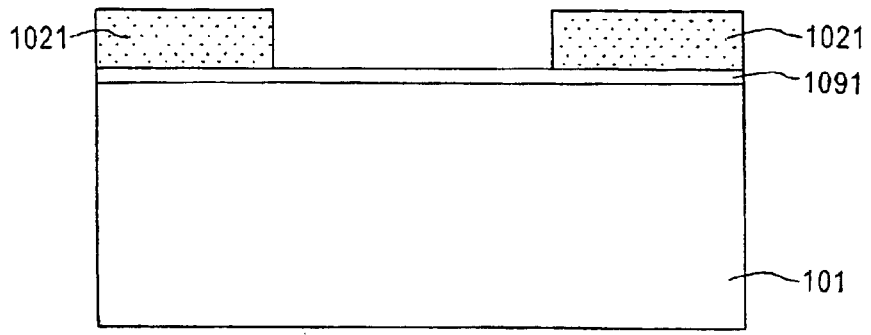
FIGS. 31 to 34 are cross-sectional views showing a process of manufacturing a conventional semiconductor device.
Figure 32:
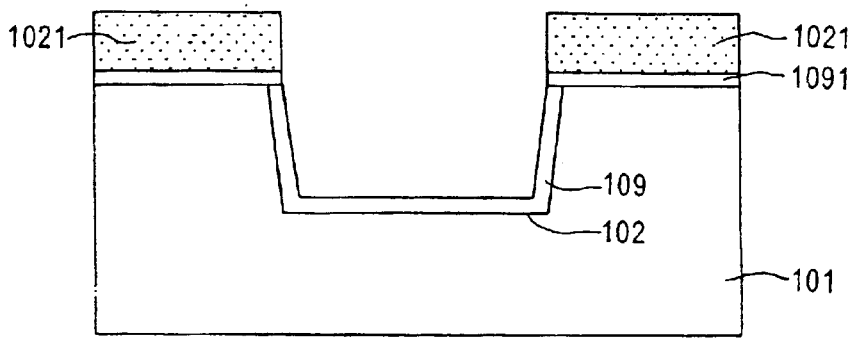
Figure 33:
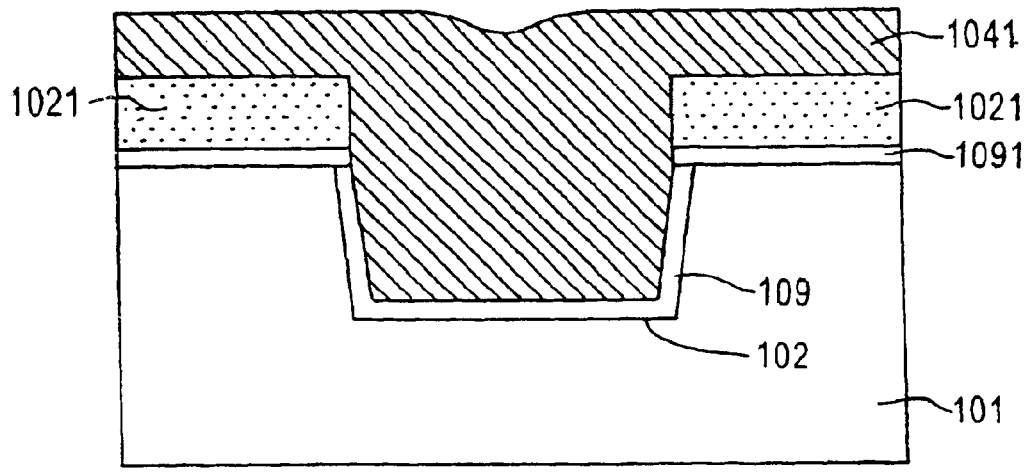
Figure 34:
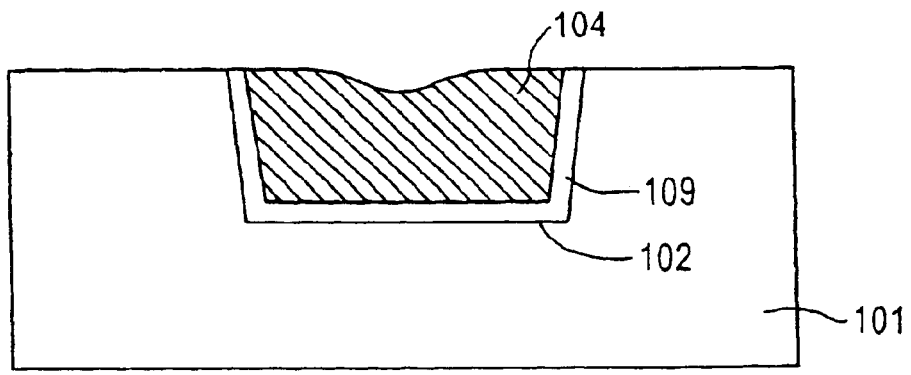
Figure 35:
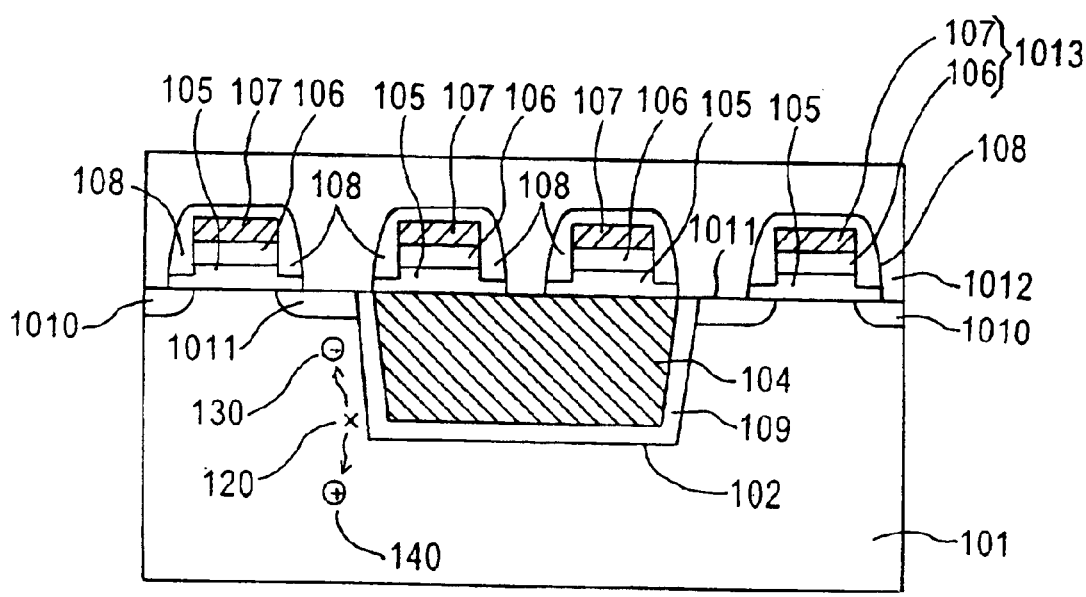
FIG. 35 is a cross-sectional view showing a conventional semiconductor device.

FIG. 25 is a cross-sectional view of a semiconductor device according to a embodiment 4 of the present invention. In the drawing, reference numeral 37 designates a polysilicon film. In other respects, the semiconductor device is equal in structure to that used in the embodiment 1.

As shown in the drawing, the polysilicon film 37 has a rough surface, and the surface has irregularities whose width or diameter is about 5 to 30 nm. The irregularities may assume any shape, such as a semi-spherical or angular pattern.

In the semiconductor device according to the embodiment 4, as in the case of the embodiment 1, the polysilicon film 3, which is formed between the semiconductor substrate 1 and the CVD silicon oxide film 4 and has a rough surface, absorbs mechanical stress. The stress exerted on the area between the CVD silicon oxide film 4 and the semiconductor substrate 1 can be mitigated to a much greater extent by changing the profile of irregularities of the rough surface. As a result, the insulation of the trench isolation structure formed from the CVD silicon oxide film suitable for miniaturizing an element is improved, and defects can be prevented from arising in the periphery of the trench, thus improving the reliability of the element. Furthermore, a leakage current, which would otherwise flow by way of defects, is prevented, so that faulty operations of the semiconductor device are prevented, thereby enabling lower power consumption.

FIG. 26 is another cross-sectional view of the semiconductor device according to the embodiment 4. The semiconductor device is equal in structure to that shown in FIG. 25, except that the polysilicon oxide film 14 is formed over the entire surface of a boundary region between the polysilicon film 37 and the gate insulating film 5.

In the semiconductor device, the polysilicon oxide film 14 is formed on the surface of the polysilicon film 37, as in the case of the embodiment 1, thereby improving the insulation of the polysilicon film 37 from the gate electrode 13 formed thereon. Accordingly, a leakage current is reliably prevented from flowing between the polysilicon film 37 and the gate electrode 13, thereby improving the characteristic of the semiconductor device to a much greater extent.

FIG. 27 is still another cross-sectional view of the semiconductor device according to the embodiment 4. In the drawing, reference numeral 38 designates a polysilicon film. The semiconductor device is equal in structure to that shown in FIG. 24, except that the polysilicon film having an irregular surface is formed on the side surface of the trench 2. Since the polysilicon film 38 having a rough surface is formed only on the internal sidewall of the trench 2, and the polysilicon film 38 is independently formed in each active region, in the semiconductor device a leakage current has no chance of flowing to adjacent active regions along the polysilicon film and there is yielded the advantage of the stress exerted on the semiconductor substrate 1 and the CVD silicon oxide film 4 being mitigated. So long as the polysilicon films 38 are provided in active regions so as to become separated from one another, the polysilicon film may be provided in a portion of the bottom surface of the trench.

As in the case of the embodiment 1, when the embodiment 4 is applied to a DRAM memory cell in which a capacitor is formed so as to connect to the source/drain region 11, the refresh characteristic of DRAM is improved.

FIG. 28 is a cross-sectional view showing one process of manufacturing the semiconductor device according to the embodiment 4. In the drawing, reference numeral 39 designates an amorphous silicon film.

First, as in the case of the embodiment 1, after formation of the trench 2 on the surface of the semiconductor substrate 1, the silicon oxide film 9 is formed by thermal oxidation within the trench 2. As in the case of the embodiment 1, the silicon oxide film 9 may not be formed in some cases.

Next, the amorphous silicon film 39 is deposited. FIG. 28 is a cross-sectional view of the element of the semiconductor device after completion of the foregoing processing step. Subsequently, the semiconductor substrate is heated at 500 to 600° C. for about two to ten minutes in a vacuum, so that a polysilicon film having irregularities, such as the polysilicon film 37 shown in FIG. 25, is formed.

Even when, after formation of the trench 2, and the silicon oxide film 9, as required, silicon is deposited in a silane ($SiH_4$) gas at a temperature ranging from 550 to 600° C. through use of low pressure CVD, as in the case of the embodiment 1, the polysilicon film 37 having an irregular surface is formed.

Under another method, even when, after formation of the polysilicon film 32, the semiconductor substrate is subjected to wet etching through use of an phosphoric acid, as in the case of the embodiment 1, the polysilicon film 37 having an irregular surface can be produced.

In either case, the processing steps subsequent to the step of formation of the CVD silicon oxide film 41 are th same as those required in the embodiment 1.

As in the embodiment 1, the semiconductor device manufacturing method according to the embodiment 4 enables manufacture of a semiconductor device in which mechanical stress is absorbed by means of a polysilicon film formed between a semiconductor substrate and a CVD silicon oxide film, and the stress acting on the area between the CVD silicon oxide film and the semiconductor substrate is mitigated to a much greater extent by means of the rough surface of the polysilicon film. As a result, the insulation of the trench isolation structure formed from the CVD silicon oxide film suitable for miniaturizing an element is improved, and defects can be prevented from arising in the periphery of the trench, thereby resulting in a semiconductor device having improved reliability. Furthermore, a leakage current, which would otherwise flow by way of defects, is prevented, thereby resulting in a semiconductor device which prevents faulty operations and involves lower power consumption.

As shown in FIG. 26, as a result of the gate insulating film 5 being formed by thermal oxidation, the polysilicon oxide film 14 is formed on the surface of the polysilicon film 3, thereby improving the insulation of the polysilicon film 3 from the gate electrode 13 formed thereon. A leakage current is reliably prevented from flowing between the polysilicon film 3 and the gate electrode 13, thereby realizing a semiconductor device having an improved characteristic.

As in the case of the embodiment 1, after formation of the polysilicon film 37, the semiconductor substrate is anisotropically or isotropically etched, and the processing steps subsequent to the step of formation of the CVD silicon oxide film 41 are performed in the same manner as in the embodiment 1. As shown in FIG. 27, there is produced a semiconductor device in which the polysilicon film 38 having a rough surface is formed on only the internal sidewall of the trench 2. In this case, so long as the polysilicon films 38 provided in active regions are separated from one another, the polysilicon film may be provided in a portion of the bottom surface of the trench.

Under the semiconductor device manufacturing method according to the embodiment 4, since the polysilicon film 38 is independently provided in each active region, there is implemented a semiconductor device in which a leakage current has not chance flowing to adjacent active regions along the polysilicon film and in which stress exerted on the area between the semiconductor substrate 1 and the CVD silicon oxide film 4 is mitigated.

Further, after formation of the interlayer insulating film 12, by formation of the capacitor 15 by way of a contact hole connecting to the source/drain region 11, DRAM memory cells having an improved refresh characteristic can be produced.

Since the present invention is implemented in the form of the aforementioned structures, the invention yields the following advantageous results:

According to the present invention, since a polysilicon film is formed between a semiconductor substrate and a CVD silicon oxide film, the polysilicon film acts as a stress mitigation film by structural deformation of the stress mitigation film along grain boundaries of polysilicon, thereby absorbing mechanical stress developing between the semiconductor substrate and the CVD silicon oxide film at the time of heat treatment. As a result, the mechanical stress can be mitigated. The insulation of the trench isolation structure formed from the CVD silicon oxide film suitable for miniaturizing an element is improved, and defects can be prevented from arising in the semiconductor substrate around the trench, thereby improving the reliability of the element. Further, there is prevented a leakage current, which would otherwise flow by way of defects, thereby preventing faulty operations of the semiconductor device and resulting in a reduction in power consumption.

Since the polysilicon films provided in active regions adjacent to one another by way of the trench isolation structure are independent of one another, a leakage current has no chance of flowing to adjacent active regions along the polysilicon film, thus enabling mitigation of stress exerted on the area between the semiconductor substrate and the CVD silicon oxide film.

In addition, a polysilicon oxide film formed between the CVD silicon oxide film and the polysilicon film prevents irregularities, which would otherwise arise in the top surface of the polysilicon film, and a drop in the threshold value due to the reverse narrow channel effect is prevented, thereby preventing faulty operations of the semiconductor device and a break in wiring layers. As a result, the reliability of the semiconductor device is improved.

Further, a polysilicon nitride film is formed on the surface of the polysilicon film formed between the semiconductor substrate and the CVD silicon oxide film and acts in the direction opposite to that of the stress acting on the CVD silicon oxide film, thereby mitigating the stress exerted on the area between the CVD silicon oxide film and the semiconductor substrate to a much greater extent. As a result, the insulation of the trench isolation structure formed from the CVD silicon oxide film suitable for miniaturizing an element is improved, and defects can be prevented from arising in the periphery of the trench, thus improving the reliability of the element. Furthermore, a leakage current, which would otherwise flow by way of defects, is prevented, so that faulty operations of the semiconductor device are prevented, thereby enabling lower power consumption.

Since the polysilicon film formed between the semiconductor substrate and the CVD silicon oxide film has a rough surface, the stress exerted on the area between the CVD silicon oxide film and the semiconductor substrate can be mitigated to a much greater extent by changing the profile of irregularities of the rough surface. As a result, the insulation of the trench isolation structure formed from the CVD silicon oxide film suitable for miniaturizing an element is improved, and defects can be prevented from arising in the periphery of the trench, thus improving the reliability of the element. Furthermore, a leakage current, which would otherwise flow by way of defects, is prevented, so that faulty operations of the semiconductor device are prevented, thereby enabling lower power consumption.

Even when the gate electrode of the MOS transistor formed in the active region is extended to the area above the trench isolation structure, the trench isolation structure is filled with the CVD silicon oxide film, thereby improving insulation of the trench isolation structure and preventing a leakage current from flowing.

The edge of the polysilicon film is formed into a polysilicon oxide film, thereby improving insulation of the polysilicon film from the gate electrode formed thereon. As a result, a leakage current is reliably prevented from flowing between the polysilicon film and the gate electrode, thus improving the characteristic of the semiconductor device to a much greater extent.

In addition, even in a DRAM memory cell having a capacitor which is formed so as to connect to the source/drain region by way of a contact hole formed in an interlayer insulating film, the semiconductor device yields the advantage of improving the refresh characteristic of DRAM by prevention of a leakage current.

A thermal oxide film is formed on the surface of the semiconductor substrate within a trench, so that defects occurring in the surface of the semiconductor substrate at the time of formation of the trench are eliminated. Accordingly, the reliability of an element is improved, and a leakage current, which would otherwise flow by way of defects, is prevented. As a result, faulty operations of the semiconductor device are prevented, and lower power consumption can be achieved.

A semiconductor manufacturing method according to the present invention enables manufacture of a semiconductor device having a stress mitigation film which absorbs the mechanical stress that develops in the area between the semiconductor substrate and the CVD silicon oxide film at the time of heat treatment, by deformation of the polysilicon film along grain boundaries of polysilicon. As a result, the insulation of the trench isolation structure formed from the CVD silicon oxide film suitable for miniaturizing an element is improved, and defects can be prevented from arising in the periphery of the trench, thereby resulting in a semiconductor device having improved reliability. Furthermore, a leakage current, which would otherwise flow by way of defects, is prevented, thereby resulting in a semiconductor device which prevents faulty operations and involves lower power consumption.

The semiconductor substrate is etched after formation of the polysilicon film, thereby removing the polysilicon film from the bottom of the trench. Consequently, the polysilicon films can be formed in active regions so as to become independent of one another, so that there is produced a semiconductor device in which a leakage current has no chance of flowing to adjacent active regions along the polysilicon film and in which the stress exerted on the area between the semiconductor substrate and the CVD silicon oxide film is mitigated.

Since a polysilicon oxide film is formed on the surface of the polysilicon film, irregularities, which would otherwise arise in the top surface of the polysilicon film, are reliably prevented when an upper portion of the CVD silicon oxide film is removed at the final phase of formation of the trench isolation structure. As a result, there can be produced a semiconductor device which is prevented from performing faulty operations, by prevention of a drop in the threshold value due to the reverse narrow channel effect, in which a break in wiring layers is prevented, and which has improved reliability.

A polysilicon nitride film can be formed on the surface of the polysilicon film formed between the semiconductor substrate and the CVD silicon oxide film. The polysilicon nitride film acts in the direction opposite to that in which the stress acts on the CVD silicon oxide film filled in the trench, thereby producing a semiconductor device in which the stress exerted on the area between the CVD silicon oxide film and the semiconductor substrate is mitigated to a much greater extent.

Since the polysilicon film having a rough surface is formed between the semiconductor substrate and the CVD silicon oxide film, there can be produced a semiconductor device in which the stress exerted on the area between the CVD silicon oxide film and the semiconductor substrate is mitigated to a much greater extent by changing the profile of irregularities of the rough surface.

A polysilicon film having a rough surface can be formed by addition of only an etching step to the step of formation of a polysilicon film. In such a case, the stress exerted on the area between the CVD silicon oxide film and the semiconductor substrate can be readily mitigated to a much greater extent.

A polysilicon film having a rough surface is formed by subjecting the semiconductor substrate to heat treatment in a vacuum after formation of an amorphous silicon film. In a simple process, there can be manufactured a semiconductor device in which the stress exerted on the area between the CVD silicon oxide film and the semiconductor substrate is mitigated to a much greater extent.

Even when the gate electrode of the MOS transistor formed in the active region is extended to the area above the trench isolation structure, in a simple process there can be manufactured a semiconductor device having a superior insulating characteristic and in which a leakage current can be prevented.

In addition, since there is formed a capacitor connecting to the source/drain region by way of the contact hole formed in the interlayer insulating film, the present invention yields the advantage of being able to produce a DRAM memory cell having an improved refresh characteristic.

Further, since a thermal oxide film is formed by thermal oxidation of the semiconductor substrate after formation of a trench, the defects occurred in the surface of the semiconductor substrate during formation of the trench are eliminated. Therefore, there can be formed a semiconductor device having improved reliability. Further, since a leakage current, which would otherwise flow by way of defects, is prevented, thereby resulting in a semiconductor device which prevents faulty operations and involves lower power consumption.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 10-193037 filed on Jul. 8, 1998 including specification, claims, drawings and summary are incorporated herein by reference in its entirety.

What is claimed is:

1. A method of manufacturing a semiconductor device, the method comprising the steps of:
   forming a trench to surround an active region by etching a main surface of a semiconductor substrate while the main surface in the active region of the semiconductor substrate is masked;
   forming a polysilicon film, at a thickness of about 20 to about 50 nm, to cover the surface of the trench;
   depositing a CVD silicon oxide film over the entire surface of the trench by filling the trench;
   subjecting the semiconductor substrate to heat treatment;
   planarizing the surface of the CVD silicon oxide film;
   removing the mask; and
   forming an element on the main surface in the active region of the semiconductor substrate.

2. A method of manufacturing a semiconductor device, the method comprising the steps of:
   forming a trench to surround an active region by etching a main surface of a semiconductor substrate while the main surface in the active region of the semiconductor substrate is masked;
   forming a polysilicon film to cover the surface of the trench;
   depositing a CVD silicon oxide film over the entire surface of the trench by filling the trench;
   subjecting the semiconductor substrate to heat treatment;
   planarizing the surface of the CVD silicon oxide film;
   removing the mask; and
   forming an element on the main surface in the active region of the semiconductor substrate,
   wherein after the step of forming a polysilicon film, the method further comprises the step of etching the polysilicon film formed on the surface of the bottom of the trench in the semiconductor substrate.

3. A method of manufacturing a semiconductor device, the method comprising the steps of:
   forming a trench to surround an active region by etching a main surface of a semiconductor substrate while the main surface in the active region of the semiconductor substrate is masked;
   forming a polysilicon film to cover the surface of the trench;
   depositing a CVD silicon oxide film over the entire surface of the trench by filling the trench;
   subjecting the semiconductor substrate to heat treatment;
   planarizing the surface of the CVD silicon oxide film;
   removing the mask; and
   forming an element on the main surface in the active region of the semiconductor substrate,
   wherein after the step of forming a polysilicon film, the method further comprises the step of forming a thermal oxide film on the surface of the polysilicon film.

4. The semiconductor device manufacturing method according to claim 1, wherein after the step of forming a polysilicon film, the method further comprises the step of forming a silicon nitride film on the surface of the polysilicon film.

5. The semiconductor device manufacturing method according to claim 1, wherein the surface of the polysilicon film has irregularities.

6. A method of manufacturing a semiconductor device, the method comprising the steps of:
   forming a trench to surround an active region by etching a main surface of a semiconductor substrate while the main surface in the active region of the semiconductor substrate is masked;
   forming a polysilicon film to cover the surface of the trench;
   depositing a CVD silicon oxide film over the entire surface of the trench by filling the trench;
   subjecting the semiconductor substrate to heat treatment;
   planarizing the surface of the CVD silicon oxide film;
   removing the mask; and
   forming an element on the main surface in the active region of the semiconductor substrate, wherein after the step of forming a polysilicon film, the method further comprises the step of forming irregularities by etching the surface of the polysilicon film.

7. The semiconductor device manufacturing method according to claim 1, wherein the step of formation of the polysilicon film comprises a step of formation of an amorphous silicon film and a step of subjecting the semiconductor substrate to heat treatment in a vacuum.

8. The semiconductor device manufacturing method according to claim 1, further comprising the steps of:

forming a gate insulating film on the main surface of the semiconductor substrate by thermal oxidation;

forming a gate electrode on the surface of the gate insulating film, and forming source drain regions on the main surface of the semiconductor substrate.

9. The semiconductor manufacturing method according to claim 8, further comprising the steps of:

forming a sidewall on the side surface of the gate electrode;

forming an interlayer insulating film over the entire surface of the semiconductor substrate;

forming an opening to permit communication between the surface of the interlayer insulating film and either the source region or the drain region; and forming a capacitor to be connected to either the source region or the drain region by way of the opening.

10. The semiconductor manufacturing method according to claim 8, wherein the after the step of forming a trench and prior to the step of forming a polysilicon film, the method further comprises the step of forming a thermal oxide film on the surface of the semiconductor substrate within the trench.

* * * * *